United States Patent
Lee et al.

(10) Patent No.: US 11,489,250 B2
(45) Date of Patent: Nov. 1, 2022

(54) ELECTRONIC DEVICE

(71) Applicant: DENSO CORPORATION, Kariya (JP)

(72) Inventors: Jungaun Lee, Kariya (JP); Sho Matsumoto, Kariya (JP)

(73) Assignee: DENSO CORPORATION, Kariya (JP)

( * ) Notice: Subject to any disclaimer, the term of this patent is extended or adjusted under 35 U.S.C. 154(b) by 100 days.

(21) Appl. No.: 17/173,338

(22) Filed: Feb. 11, 2021

(65) Prior Publication Data

US 2021/0280966 A1 Sep. 9, 2021

(30) Foreign Application Priority Data

Mar. 5, 2020 (JP) .............................. JP2020-038072

(51) Int. Cl.
*H01Q 1/42* (2006.01)
*H05K 5/04* (2006.01)
*H05K 5/02* (2006.01)

(52) U.S. Cl.
CPC ............ *H01Q 1/42* (2013.01); *H05K 5/0247* (2013.01); *H05K 5/04* (2013.01)

(58) Field of Classification Search
CPC ........... H01Q 1/42; H05K 5/0247; H05K 5/04
See application file for complete search history.

(56) References Cited

U.S. PATENT DOCUMENTS

| | | | | |
|---|---|---|---|---|
| 4,313,122 A * | 1/1982 | Dupressoir | ............ | H01Q 13/18 343/789 |
| 10,074,905 B2 * | 9/2018 | Kim | ............ | H01Q 21/28 |
| 10,218,082 B2 * | 2/2019 | Zhao | ............ | G03H 5/00 |
| 2005/0134460 A1 | 6/2005 | Usami | | |
| 2005/0231432 A1 | 10/2005 | Tsurume et al. | | |
| 2010/0127940 A1 | 5/2010 | Harihara et al. | | |
| 2011/0050505 A1 * | 3/2011 | Lim | ............ | H01Q 19/005 343/700 MS |
| 2013/0002377 A1 * | 1/2013 | Toyao | ............ | H01Q 15/0086 333/246 |
| 2019/0207301 A1 | 7/2019 | Shimura | | |
| 2021/0151902 A1 * | 5/2021 | Sugimoto | ............ | H01Q 21/24 |

FOREIGN PATENT DOCUMENTS

| | | |
|---|---|---|
| JP | H08-340211 A | 12/1996 |
| JP | 2003-143030 A | 5/2003 |
| JP | 2009-005104 A | 1/2009 |
| JP | 2012-253649 A | 12/2012 |
| JP | 2013-239956 A | 11/2013 |
| JP | 2016-181755 A | 10/2016 |
| JP | 2020-010135 A | 1/2020 |

* cited by examiner

*Primary Examiner* — Hung V Ngo
(74) *Attorney, Agent, or Firm* — Posz Law Group, PLC

(57) ABSTRACT

An antenna device includes one or more zeroth-order resonant antennas and a metal body. Each of the zeroth-order resonant antennas includes a ground plate configured to provide a ground potential, an opposing conductor arranged at a predetermined distance from the ground plate in a plate thickness direction of the ground plate, a power supply line electrically connected to the opposing conductor, and a short-circuit portion electrically connecting the opposing conductor and the ground plate. The metal body is configured to limit a propagation direction of a radio wave transmitted from or received by the one or more zeroth-order resonant antennas and has an opening.

7 Claims, 19 Drawing Sheets

ELECTRONIC DEVICE

CROSS REFERENCE TO RELATED APPLICATION

The present application claims the benefit of priority from Japanese Patent Application No. 2020-038072 filed on Mar. 5, 2020. The entire disclosure of the above application is incorporated herein by reference.

TECHNICAL FIELD

The present disclosure relates to an electronic device.

BACKGROUND

JP 2016-181755 A discloses an electronic device including a zeroth-order resonant antenna. The disclosure of JP 2016-181755 A is incorporated herein by reference as an explanation of technical elements in the present disclosure.

SUMMARY

The present disclosure provides an antenna device including one or more zeroth-order resonant antennas and a metal body. Each of the zeroth-order resonant antennas includes a ground plate configured to provide a ground potential, an opposing conductor arranged at a predetermined distance from the ground plate in a plate thickness direction of the ground plate, a power supply line electrically connected to the opposing conductor, and a short-circuit portion electrically connecting the opposing conductor and the ground plate. The metal body is configured to limit a propagation direction of a radio wave transmitted from or received by the one or more zeroth-order resonant antennas and has an opening.

BRIEF DESCRIPTION OF DRAWINGS

Objects, features and advantages of the present disclosure will become apparent from the following detailed description made with reference to the accompanying drawings. In the drawings.

DETAILED DESCRIPTION

Figure 1:
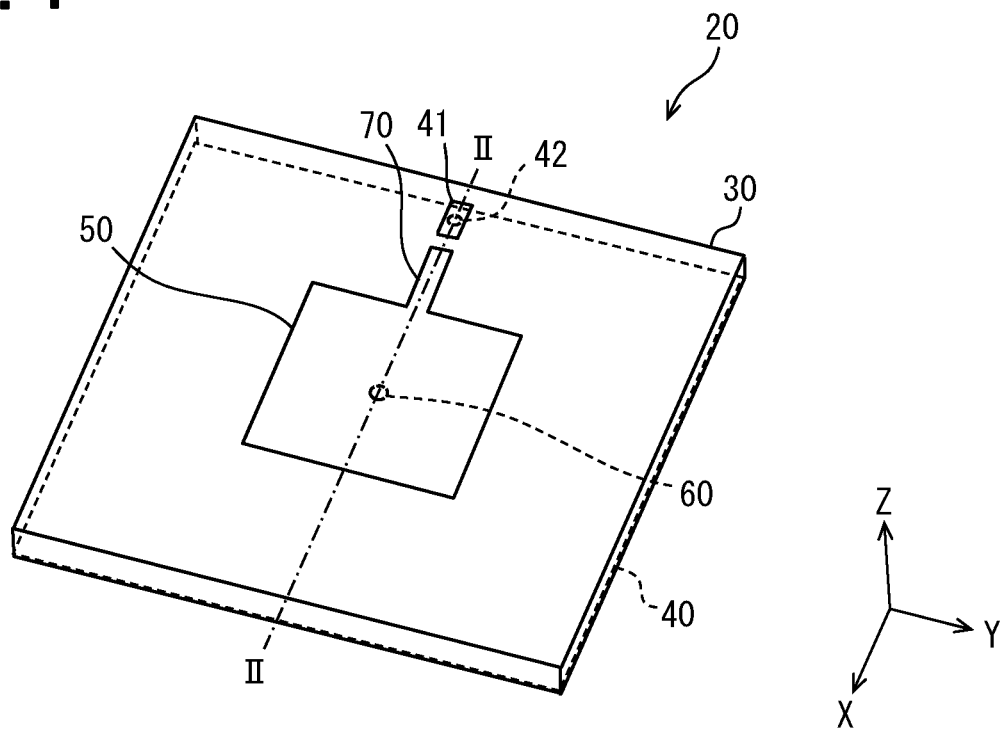
FIG. 1 is a perspective view showing a zeroth-order resonant antenna included in an electronic device of a first embodiment.

A zeroth-order resonant antenna has a structure in which a ground plate and an opposing conductor facing each other are connected by a short-circuit portion. A power supply line (power supply portion) for supplying power to the opposing conductor is connected to a central portion of the opposing conductor. The zeroth-order resonant antenna has an annular radiation characteristic, that is, non-directivity, whose center is NULL in a plane orthogonal to a plate thickness direction of the ground plate. When a metal body is arranged in the vicinity of the zeroth-order resonant antenna, since radio waves are also radiated toward the metal body, the reflection characteristics deteriorate due to the influence of reflection. In the above viewpoint, or in other viewpoints not mentioned, further improvement is required for an electronic device provided with the zeroth-order resonant antenna.

An electronic device according to an aspect of the present disclosure includes one or more zeroth-order resonant antennas and a metal body. Each of the zeroth-order resonant antennas includes a ground plate configured to provide a ground potential, an opposing conductor arranged at a predetermined distance from the ground plate in a plate thickness direction of the ground plate, a power supply line electrically connected to the opposing conductor, and a short-circuit portion electrically connecting the opposing conductor and the ground plate. The metal body is configured to limit a propagation direction of a radio wave transmitted from or received by the one or more zeroth-order resonant antennas and having an opening.

The power supply line of the zeroth-order resonant antenna extends from an edge of the opposing conductor toward the opening in a plane orthogonal to the plate thickness direction.

In the electronic device described above, the metal body limits the propagation direction of the radio wave transmitted from or received by the zeroth-order resonant antenna. The metal body has the opening, and the power supply line extends in the direction toward the opening. Accordingly, the directivity of the zeroth-order resonant antenna is biased in the direction in which the power supply line extends, that is, in the direction toward the opening. As a result, deterioration of the reflection characteristic due to the metal body can be suppressed.

An electronic device according to another aspect of the present disclosure includes one or more zeroth-order resonant antennas and a metal body. Each of the zeroth-order resonant antennas includes a ground plate configured to provide a ground potential, an opposing conductor arranged at a predetermined distance from the ground plate in a plate thickness direction of the ground plate, a plurality of power supply lines electrically connected to the opposing conductor and extending in different directions from different positions of edges of the opposing conductor so as to surround the opposing conductor in a plane orthogonal to the plate thickness direction, a short-circuit portion electrically connecting the opposing conductor and the ground plate, and a power supply controller configured to control power supply to the power supply lines. The metal body is configured to limit a propagation direction of a radio wave transmitted from or received by the one or more zeroth-order resonant antennas and having an opening.

The power supply controller is configured to supply power to a part of the power supply lines including the power supply line having an extension direction closest to a direction from the opposing conductor toward the opening or the two power supply lines sandwiching the direction toward the opening in the plane.

In the electronic device described above, the zeroth-order resonant antenna includes the plurality of power supply lines, and the power supply controller controls the power supply to the plurality of power supply lines. The power supply controller supply power only to a part of the plurality of power supply lines and not to the remaining power supply lines. The part of power supply lines to which power is supplied includes at least the power supply line whose extension direction is closest to the opening, or at least two power supply lines sandwiching the direction toward the opening in a plan view. The directivity of the zeroth-order resonant antenna is biased in the extension direction of the power supply line to which power is supplied. As a result, deterioration of the reflection characteristic due to the metal body can be suppressed.

Embodiments will be described with reference to the drawings. In the following embodiments, functionally or structurally corresponding parts are assigned with the same reference numerals.

First Embodiment

First, a structure of a zeroth-order resonant antenna 20 included in an electronic device 10 of a first embodiment will be described with reference to FIG. 1 and FIG. 2.

<Structure of Zeroth-Order Resonant Antenna>

Figure 2:
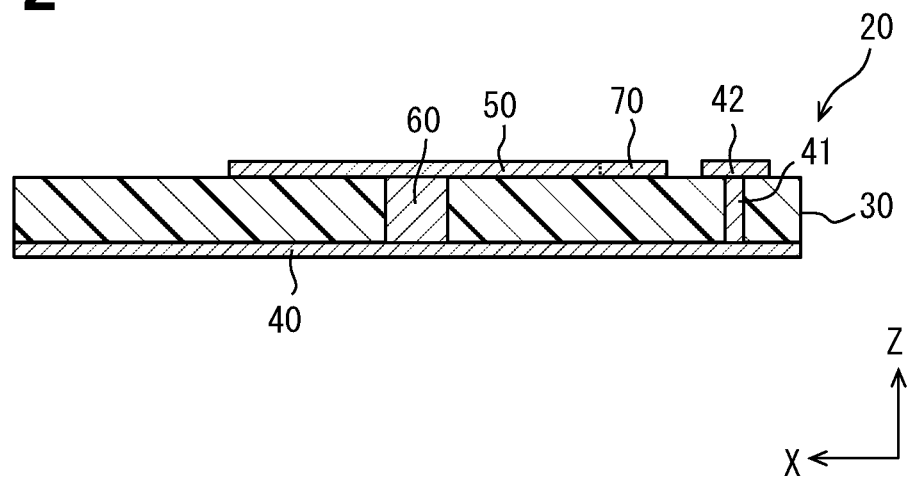
FIG. 2 is a cross-sectional view of the zeroth-order resonant antenna taken along a line II-II of FIG. 1.

As shown in FIG. 1 and FIG. 2, the zeroth-order resonant antenna 20 includes a base member 30, a ground plate 40, an opposing conductor 50, a short-circuit portion 60, and a power supply line 70. In the following, a plate thickness direction of the ground plate 40 is defined as a Z direction, and one direction orthogonal to the Z direction is defined as an X direction. The direction orthogonal to the Z direction and the X direction is defined as the Y direction. Unless otherwise specified, a shape viewed in a plane from the Z direction, that is, a shape along an XY plane defined by the X and Y directions is referred to as a planar shape. For convenience, the direction from the ground plate 40 toward the opposing conductor 50 is defined as upward, and the direction from the opposing conductor 50 toward the ground plate 40 is defined as downward.

The zeroth-order resonant antenna 20 is configured to transmit and/or receive radio waves of a predetermined operating frequency. An example of the operating frequency is 2.4 GHz. The zeroth-order resonant antenna 20 is configured to be able to transmit and/or receive radio waves in a frequency band used in a short-range wireless communication. The operating frequency may be appropriately designed and may be another frequency (for example, 5 GHz).

The base member 30 is made of a dielectric material such as resin. By using the base member 30, a wavelength shortening effect by the dielectric material can be expected. As the base member 30, for example, a member made of only resin, or a combination of resin and glass cloth, non-woven fabric, or the like can be adopted. The base member 30 functions as a holding portion that holds the ground plate 40 and the opposing conductor 50 in a predetermined positional relationship. Depending on the thickness of the base member 30, an opposite distance between the ground plate 40 and the opposing conductor 50 and a length of the short-circuit portion 60 in the Z direction can be adjusted. The base member 30 may have a single-layer structure or a multi-layer structure.

The ground plate 40 is connected to a power supply circuit (not shown) to provide a ground potential in the zeroth-order resonant antenna 20. The ground plate 40 is a flat plate-shaped conductor made of copper or the like. The direction perpendicular to a plate surface of the ground plate 40 is also substantially parallel to the Z direction. In a plan view, the area of the ground plate 40 is larger than the area of the opposing conductor 50. The ground plate 40 has a size that includes the entire opposing conductor 50. The ground plate 40 preferably has a size required for stable operation of the zeroth-order resonant antenna 20. The ground plate 40 has, for example, a planar square shape. Each side of the ground plate 40 has a length of, for example, one or more times the wavelength of the radio wave of the operating frequency, that is, one wavelength or more.

The ground plate 40 of the present embodiment is arranged on a lower surface of the base member 30. The ground plate 40 is formed by patterning a metal foil arranged on the lower surface of the base member 30. The ground plate 40 is electrically connected to a ground conductor 41 arranged on an upper surface of the base member 30 via a connecting portion 42. As described above, the zeroth-order resonant antenna 20 is configured so that power can be supplied on the upper surface side of the base member 30.

The ground conductor 41 is formed by patterning a metal foil arranged on the upper surface of the base member 30. The ground conductor 41 extends in the X direction. The connecting portion 42 is a via conductor arranged in a through hole of the base member 30. The ground plate 40 provides a ground potential by electrically connecting, for example, an external conductor of a coaxial cable to the ground conductor 41.

The planar shape of the ground plate 40 can be changed as appropriate. In the present embodiment, the planar shape of the ground plate 40 is square as an example, but as another configuration, the planar shape of the ground plate 40 may be rectangular or other polygonal shapes. Further, the planar shape of the ground plate 40 may be circular (including an ellipse). The ground plate 40 is preferably formed to have a size larger than a circle having a diameter of one wavelength.

The opposing conductor 50 is a plate-shaped conductor made of copper or the like. The opposing conductor 50 is a conductor arranged to face the ground plate 40 at a predetermined distance from the ground plate 40 in the Z direction. The opposing conductor 50 is sometimes referred to as a patch portion or a radiating element. In a plan view, the entire opposing conductor 50 overlaps the ground plate 40. That is, the entire plate surface (lower surface) of the opposing conductor 50 faces the ground plate 40 in the Z direction. The opposing conductor 50 is arranged substantially parallel to the ground plate 40. Substantially parallel is not limited to perfect parallelism. For example, the opposing conductor 50 may be tilted by several degrees to ten degrees with respect to the ground plate 40.

The opposing conductor 50 of the present embodiment is arranged on the upper surface of the base member 30. The opposing conductor 50 is formed by patterning a metal foil arranged on the upper surface of the base member 30. The opposing conductor 50 has a square shape in a plan view. An edge portion of the opposing conductor 50 has a side substantially parallel to the X direction and a side substantially parallel to the Y direction.

By arranging the opposing conductor 50 and the ground plate 40 so as to face each other, a capacitance is formed according to the area of the opposing conductor 50 and the distance between the opposing conductor 50 and the ground plate 40. The opposing conductor 50 is formed to have a size that forms a capacitance that resonates in parallel with the inductance of the short-circuit portion 60 at a target frequency. The area of the opposing conductor 50 is appropriately designed to provide the desired capacitance and thus to operate at the operating frequency.

In the present embodiment, the planar shape of the opposing conductor 50 is square as an example, but as another configuration, the planar shape of the opposing conductor 50 may be circular, regular octagon, regular hexagon, or the like. The opposing conductor 50 preferably has a line-symmetrical shape, that is, a bidirectional line-symmetric shape, with each of two straight lines orthogonal to each other as axes of symmetry. The bidirectional line symmetrical shape refers to a figure that is line-symmetric with a first straight line as an axis of symmetry, and that is also line-symmetric with respect to a second straight line that is orthogonal to the first straight line. The bidirectional line symmetrical shape corresponds to, for example, an ellipse, a rectangle, a circle, a square, a regular hexagon, a regular octagon, a rhombus, or the like. Further, the opposed conductor 50 is more preferably a point-symmetrical figure such as a circle, a square, a rectangle, or a parallelogram.

The short-circuit portion 60 electrically connects, that is, short-circuits, the ground plate 40 and the opposing conductor 50. The short-circuit portion 60 is a columnar conductor having one end connected to the ground plate 40 and the other end connected to the opposing conductor 50. The short-circuit portion 60 has, for example, a substantially circular plane. By adjusting the diameter and length of the short-circuit portion 60, the inductance provided in the short-circuit portion 60 can be adjusted. The short-circuit portion 60 is connected to substantially the center of the opposing conductor 50 in a plan view. The center of the opposing conductor 50 corresponds to the center of gravity of the opposing conductor 50.

Since the opposing conductor 50 of the present embodiment has the planar square shape, the center corresponds to an intersection of two diagonal lines of the opposing conductor 50. The short-circuit portion 60 is a via conductor arranged in a through hole of the base member 30. The number of via conductors constituting the short-circuit portion 60 is not particularly limited. The short-circuit portion 60 may be formed by a plurality of via conductors arranged in parallel between the ground plate 40 and the opposing conductor 50.

The power supply line 70 is a conductor for supplying power to the opposing conductor 50. The power supply line 70 extends from the edge portion of the opposing conductor 50 in a direction orthogonal to the Z direction. The power supply line 70 includes a portion extending from the power supply point along a virtual straight line connecting a substantially center of the opposing conductor 50 and the power supply point. One end of the power supply line 70 is connected to the edge portion of the opposing conductor 50, and the other end is electrically connected to an inner conductor of the coaxial cable. The connecting portion between the power supply line 70 and the opposing conductor 50 corresponds to the power supply point. An electric current input to the power supply line 70 via the coaxial cable propagates to the opposing conductor 50 and excites the opposing conductor 50. The power supply method is not limited to the direct power supply method. A power supply method in which the power supply line 70 and the opposing conductor 50 are electromagnetically coupled may also be adopted. The extension length and width of the power supply line 70 are set in consideration of impedance matching and the like.

The power supply line 70 of the present embodiment is a conductor arranged on the upper surface of the base member 30. This conductor is sometimes referred to as a microstrip line. The power supply line 70 extends in the X direction from one of the sides of the opposing conductor 50 that is substantially parallel to the Y direction. The power supply line 70 is connected to a substantially central portion of the opposing conductor 50 in the Y direction. The power supply line 70 and the opposing conductor 50 are arranged line-symmetrically with respect to the X-axis. A predetermined gap is provided between the power supply line 70 and the ground conductor 41. The power supply line 70 is arranged to face the ground plate 40 in the Z direction.

The zeroth-order resonant antenna 20 configured in this way has a structure in which the ground plate 40 and the opposing conductor 50 facing each other are connected by the short-circuit portion 60. This structure is a so-called mushroom structure, which is the same as a basic structure of metamaterials. Since the zeroth-order resonant antenna 20 is an antenna to which a metamaterial technology is applied, the zeroth-order resonant antenna 20 is sometimes called a metamaterial antenna.

The zeroth-order resonant antenna 20 is designed to operate in the zeroth-order resonant mode at a desired operating frequency. Among the dispersion characteristics of metamaterials, a phenomenon of resonance at a frequency at which a phase constant $\beta$ becomes zero (0) is the zeroth-order resonance. The phase constant $\beta$ is an imaginary part of a propagation coefficient $\gamma$ of a wave propagating on a transmission line. The zeroth-order resonant antenna 20 can satisfactorily transmit and/or receive radio waves in a predetermined band including the frequency at which the zeroth-order resonance occurs.

The connection between the zeroth-order resonant antenna 20 and the power supply circuit (wireless device) is not limited to the coaxial cable. The zeroth-order resonant antenna 20 and the power supply circuit may be connected by using another communication cable such as a power supply line. Further, the zeroth-order resonant antenna 20 and the power supply circuit may be connected via a matching circuit, a filter circuit, or the like in addition to the coaxial cable. The zeroth-order resonant antenna 20 may be provided integrally with the power supply circuit.

<Antenna Operation>

Next, the operation of the zeroth-order resonant antenna 20 will be described. The zeroth-order resonant antenna 20 operates by LC parallel resonance of the capacitance formed between the ground plate 40 and the opposing conductor 50 and the inductance provided in the short-circuit portion 60. In the zeroth-order resonant antenna 20, the opposing conductor 50 is short-circuited to the ground plate 40 by the short-circuit portion 60 provided in the central region of the opposing conductor 50. The area of the opposing conductor 50 is an area that forms a capacitance that resonates in parallel with the inductance of the short-circuit portion 60 at a desired frequency (operating frequency).

Therefore, when electric power of the operating frequency is supplied, parallel resonance occurs due to energy exchange between the inductance and the capacitance, and an electric field perpendicular to the ground plate 40 and the opposing conductor 50 is generated between the ground plate 40 and the opposing conductor 50. That is, an electric field in the Z direction is generated. This vertical electric field propagates from the short-circuit portion 60 toward the edge portion of the opposing conductor 50, becomes vertically polarized at the edge of the opposing conductor 50, and propagates in space. The vertically polarized wave here refers to a radio wave in which the vibration direction of the electric field is perpendicular to the ground plate 40 and the opposing conductor 50. Further, the zeroth-order resonant antenna 20 receives a vertically polarized wave coming from the outside of the zeroth-order resonant antenna 20 by LC parallel resonance.

The resonance frequency of the zeroth-order resonance does not depend on the antenna size. Therefore, the length of one side of the opposing conductor 50 can be made shorter than ½ wavelength of the zeroth-order resonance frequency (operating frequency). For example, even if one side has a length equivalent to ¼ wavelength, zeroth-order resonance can be generated. For example, when the operating frequency is 2.4 GHz, the wavelength λε can be obtained by (300 [mm/s]/2.4 [GHz])/square root of the dielectric constant of the base member 30 in the configuration including the base member 30.

<Directivity Adjustment Method>

Figure 3:
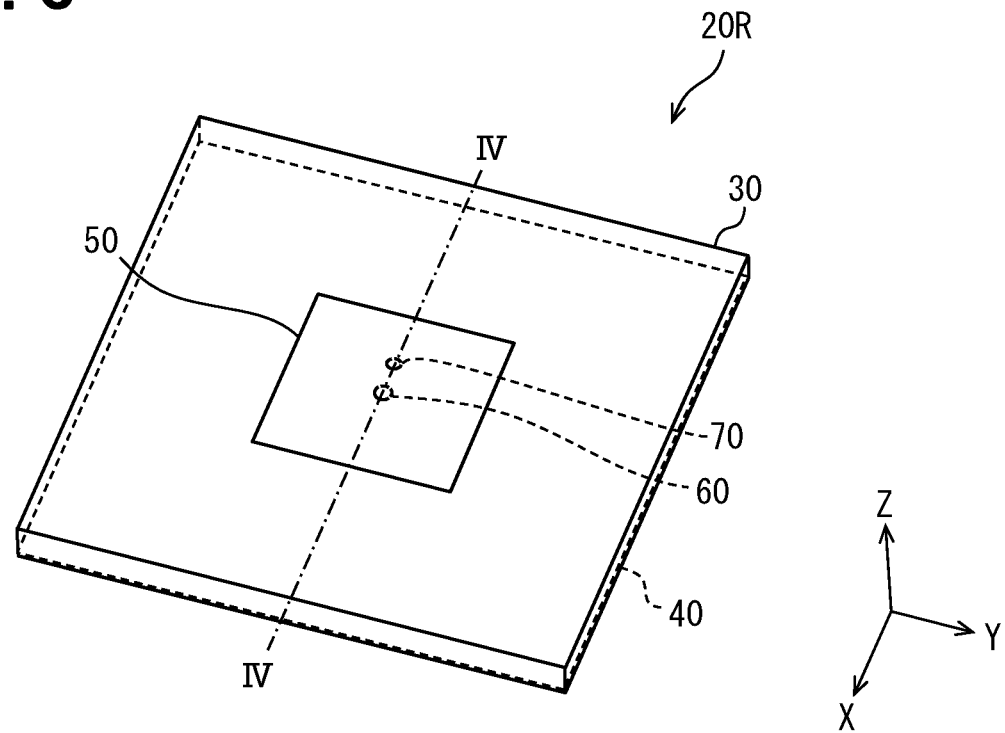
FIG. 3 is a perspective view showing a zeroth-order resonant antenna according to a reference example.
Figure 4:
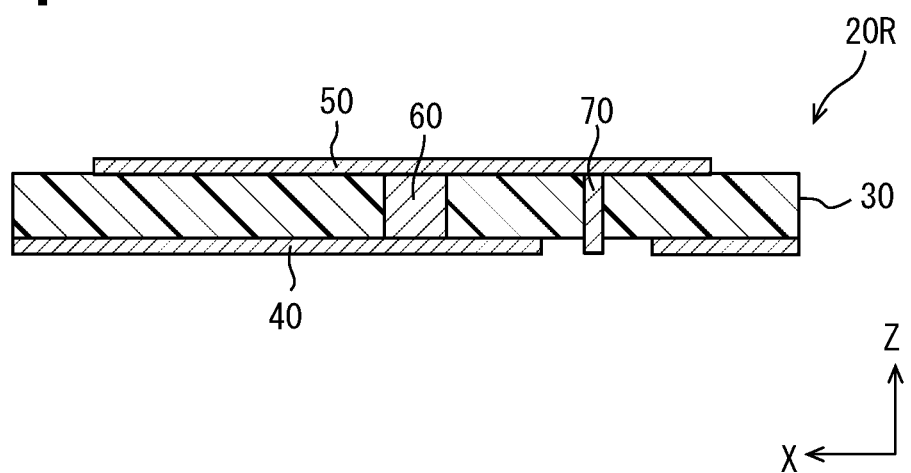
FIG. 4 is a sectional view of the zeroth-order resonant antenna taken along line IV-IV of FIG. 3.

Next, a method of adjusting the directivity of the zeroth-order resonant antenna 20 will be described. FIG. 3 and FIG. 4 show a zeroth-order resonant antenna 20R according to a reference example. FIG. 5A, FIG. 5B, FIG. 6A and FIG. 6B show results (radiation characteristics) of the electromagnetic field simulation between the reference example and the present embodiment. In the reference example and the present embodiment, the operating frequency, the configuration (dielectric constant and thickness) of the base member 30, and the diameter of the short-circuit portion 60 are the same. Then, a design optimization is performed according to the size (area) of the opposing conductor 50.

As the reference example, the zeroth-order resonant antenna 20R shown in FIG. 3 and FIG. 4 is configured to supply power on the lower surface side of the base member 30. In other words, the power supply line 70 is connected not to the edge portion of the opposing conductor 50 but to the central portion surrounded by the edge portion. In the reference example, the same reference numerals are given to the portions functionally and/or structurally corresponding to the zeroth-order resonant antenna 20 shown in the present embodiment.

The power supply line 70 extends in the Z direction. One end of the power supply line 70 is connected to the lower surface of the opposing conductor 50, and the other end is exposed to the lower surface side of the base member 30 so that the power supply line 70 can be connected to a communication cable (for example, a coaxial cable). On the lower surface of the base member 30, the ground plate 40 is not arranged around the power supply line 70. A predetermined gap is provided between the power supply line 70 and the ground plate 40. The power supply line 70 is provided by a via conductor, a metal pin, or the like arranged in a through hole of the base member 30. The other configurations are the same as those of the zeroth-order resonant antenna 20.

Figure 5A:
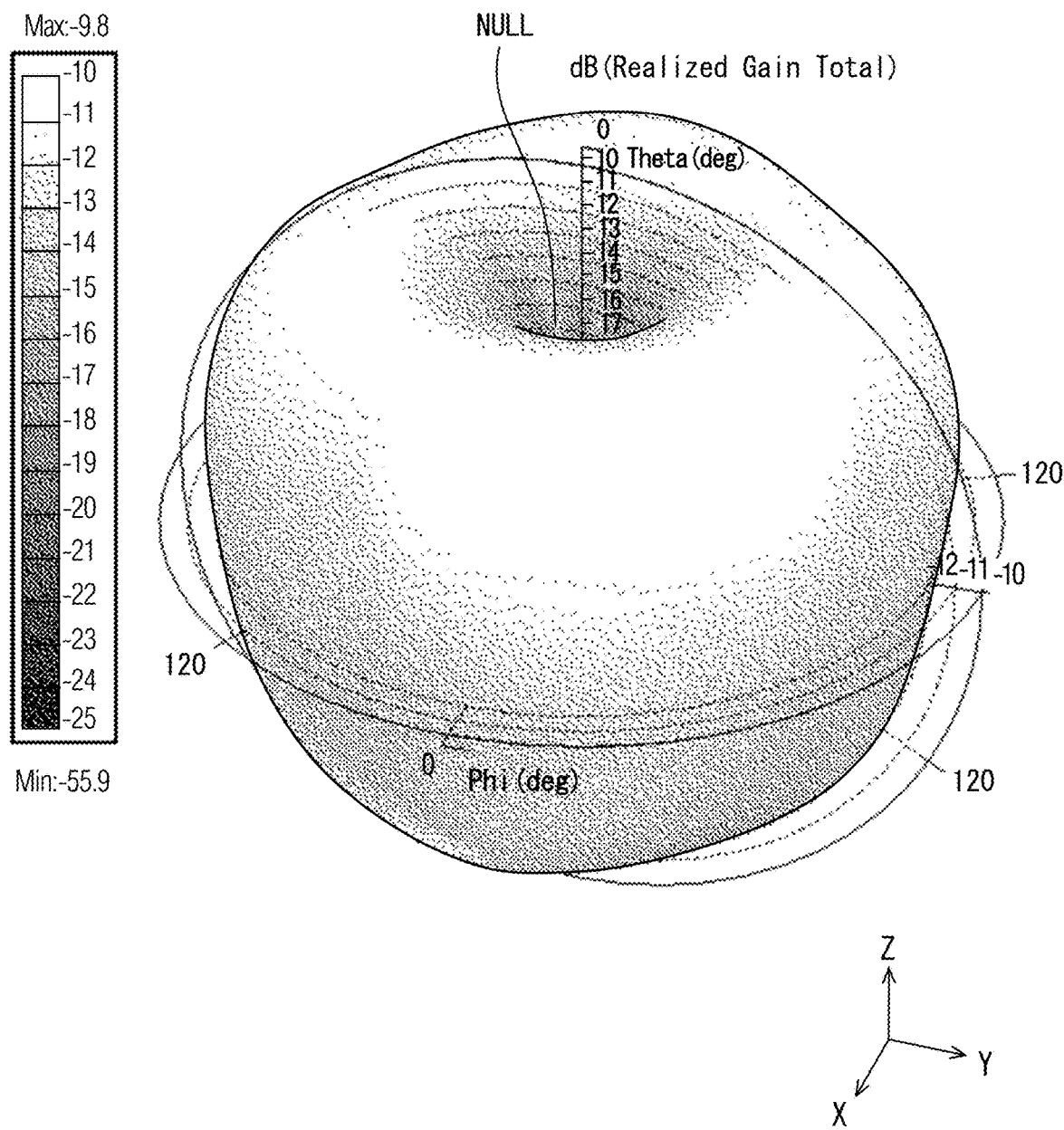
FIG. 5A and FIG. 5B are diagrams showing a radiation characteristic of the zeroth-order resonant antenna according to the reference example.
Figure 5B:
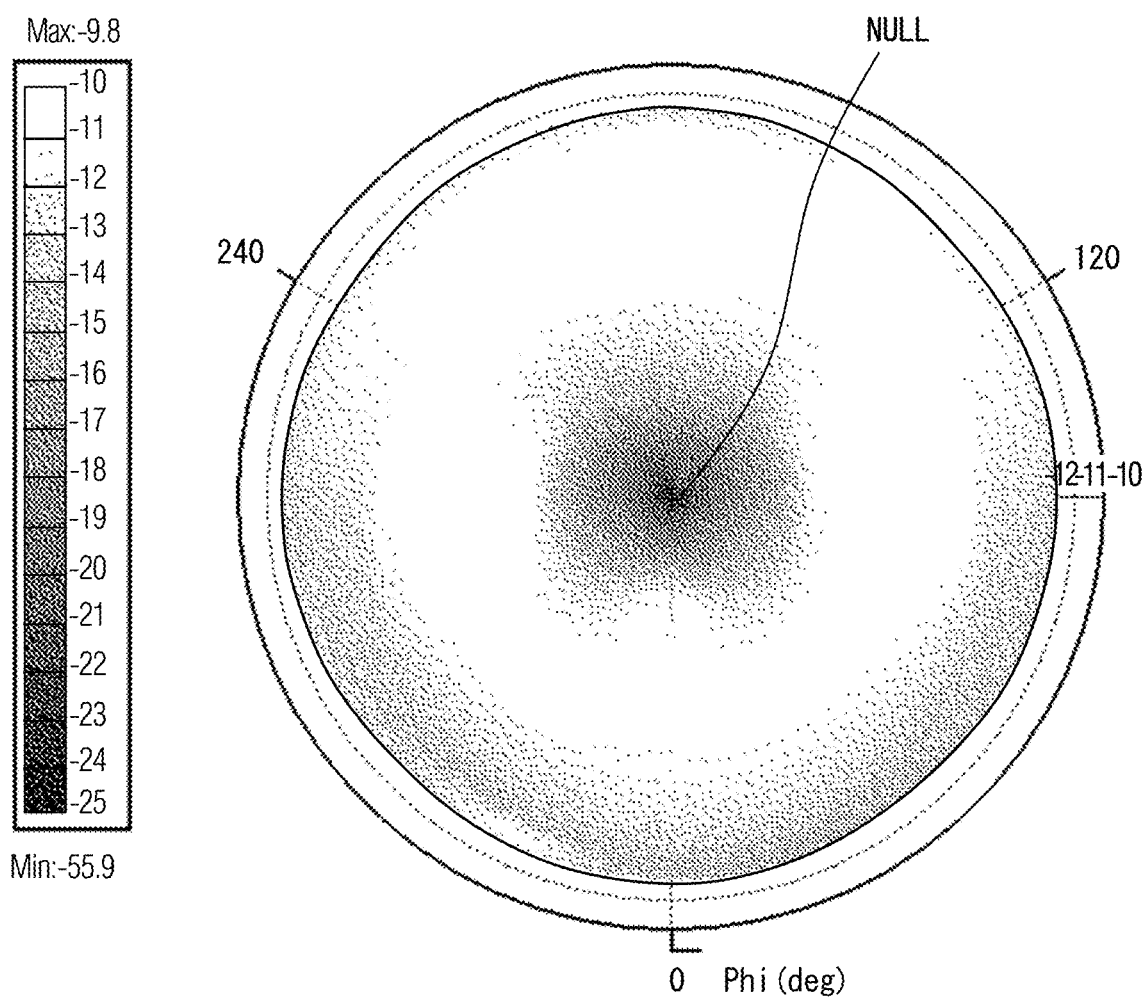

FIG. 5A and FIG. 5B show the radiation characteristic of the zeroth-order resonant antenna 20R. The vertical electric field generated by the LC parallel resonance propagates in all directions of the edge portion of the opposing conductor 50 centering on the short-circuit portion 60. Since the propagation direction of the vertical electric field is symmetric with respect to the short-circuit portion 60, the zeroth-order resonant antenna 20R has directivity in all directions from the substantially center toward the edge portion of the opposing conductor 50 at the operating frequency. As shown in FIG. 5, the zeroth-order resonant antenna 20R has an annular (doughnut-shaped) radiation characteristic having a null center, that is, non-directivity in the XY plane.

Figure 6A:
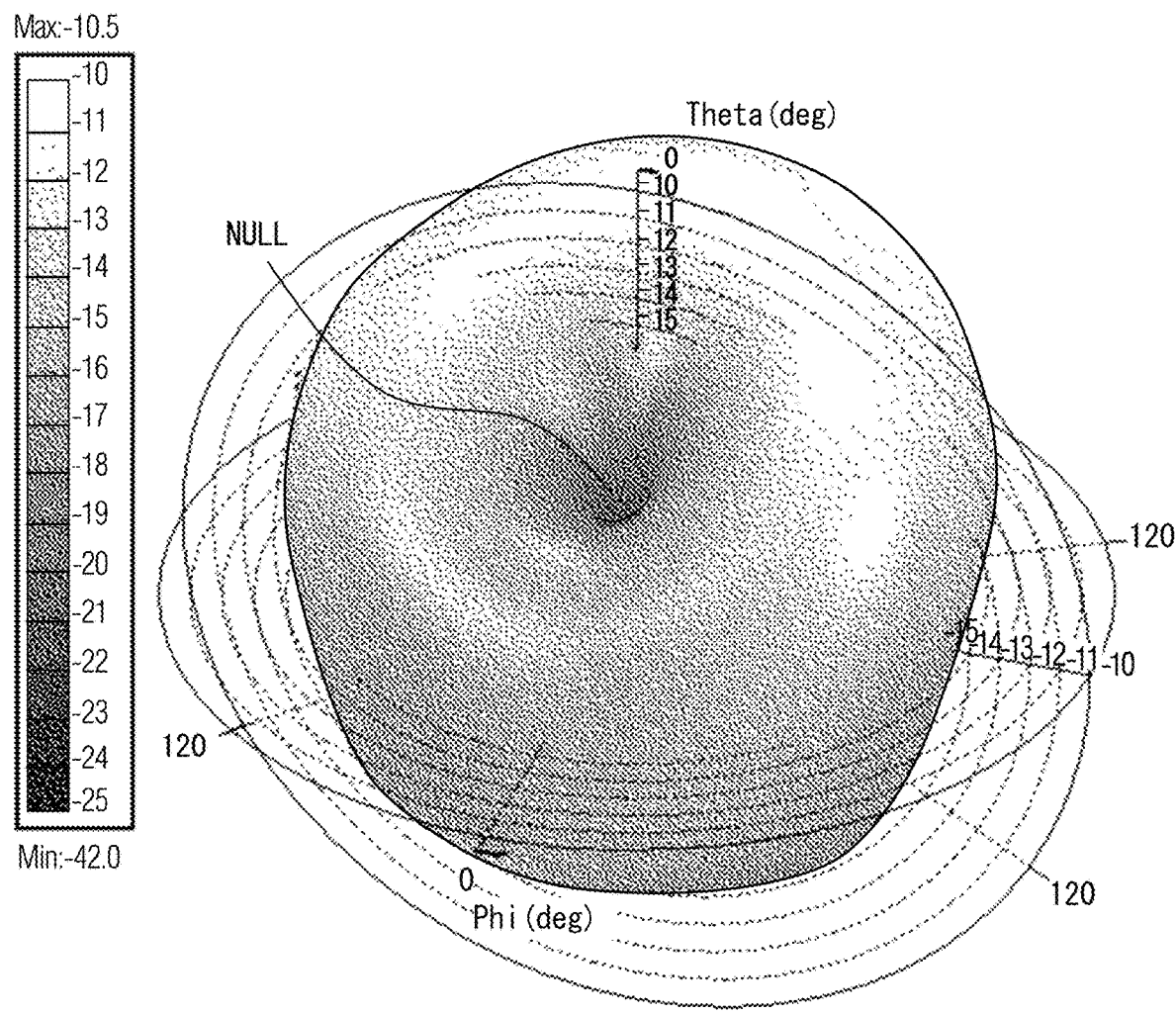
FIG. 6A is a diagram showing an extension direction of a power supply line in the zeroth-order resonant antenna shown in FIG. 1.
Figure 6A:
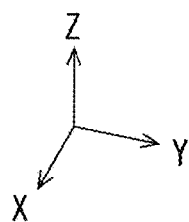
Figure 6B:
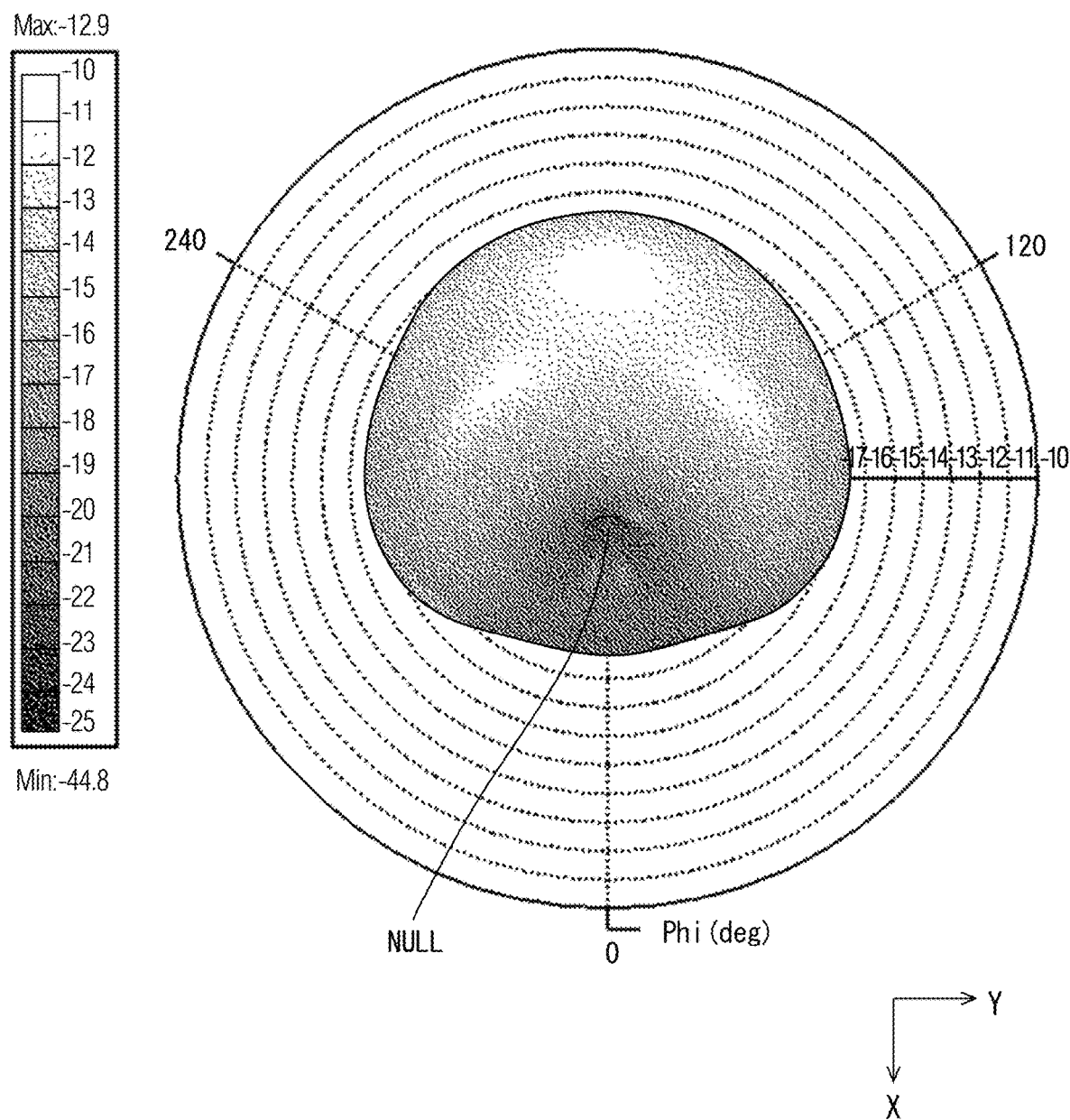
FIG. 6B is a diagram showing a radiation characteristic of the zeroth-order resonant antenna shown in FIG. 6A.

FIG. 6A and FIG. 6B shows the radiation characteristic of the zeroth-order resonant antenna 20 (see FIG. 1) described above. As described above, in the zeroth-order resonant antenna 20, the power supply line 70 extends from the edge portion of the opposing conductor 50 in the direction perpendicular to the Z axis (X direction). Due to the influence of the power supply line 70 arranged to face the ground plate 40, in the zeroth-order resonant antenna 20, the NULL is tilted to the side opposite to the power supply line 70, and the directivity is biased to the side where the power supply line 70 is arranged. In this way, the zeroth-order resonant antenna 20 has directivity in the extending direction of the power supply line 70.

FIG. 7A to FIG. 10B are diagrams showing changes in radiation characteristic depending on the extending direction of the power supply line 70 with respect to FIG. 6A and FIG. 6B. FIG. 7A to FIG. 10B show the results (radiation characteristics) of the electromagnetic field simulation of the zeroth-order resonant antenna 20 as in FIG. 6A and FIG. 6B. In the electromagnetic field simulation, only the extension direction of the power supply line 70 is different from the extension direction of power supply line 70 in FIG. 1 and the other conditions are the same. In FIG. 7A, FIG. 8A, FIG. 9A, and FIG. 10A, for convenience, the zeroth-order resonant antenna 20 is shown with omitting the base member 30.

Figure 7A:
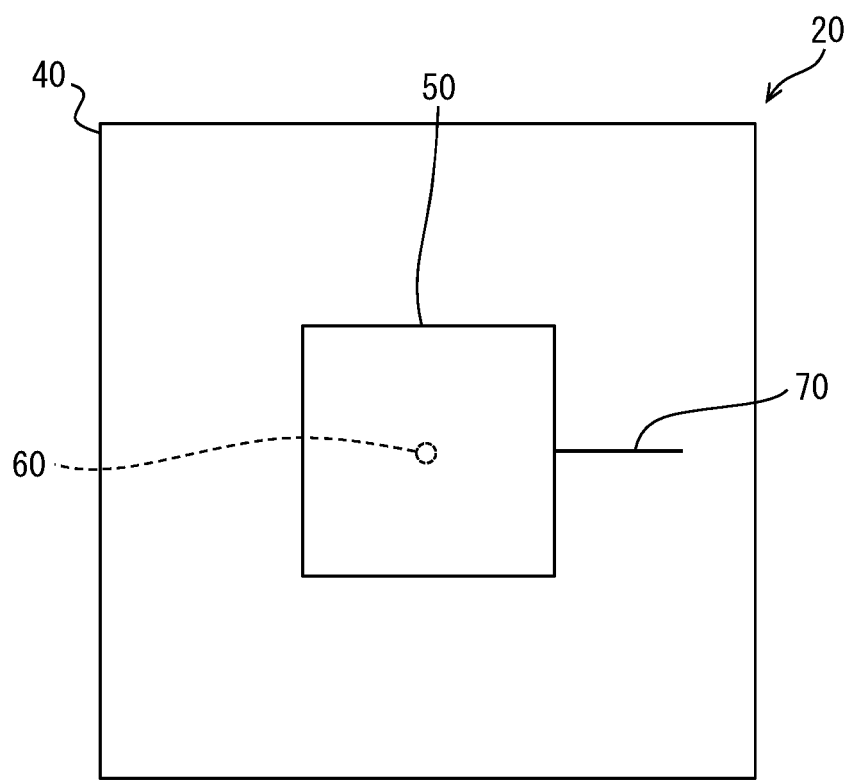
FIG. 7A is a diagram showing an extension direction of a power supply line in a zeroth-order resonant antenna.
Figure 7B:
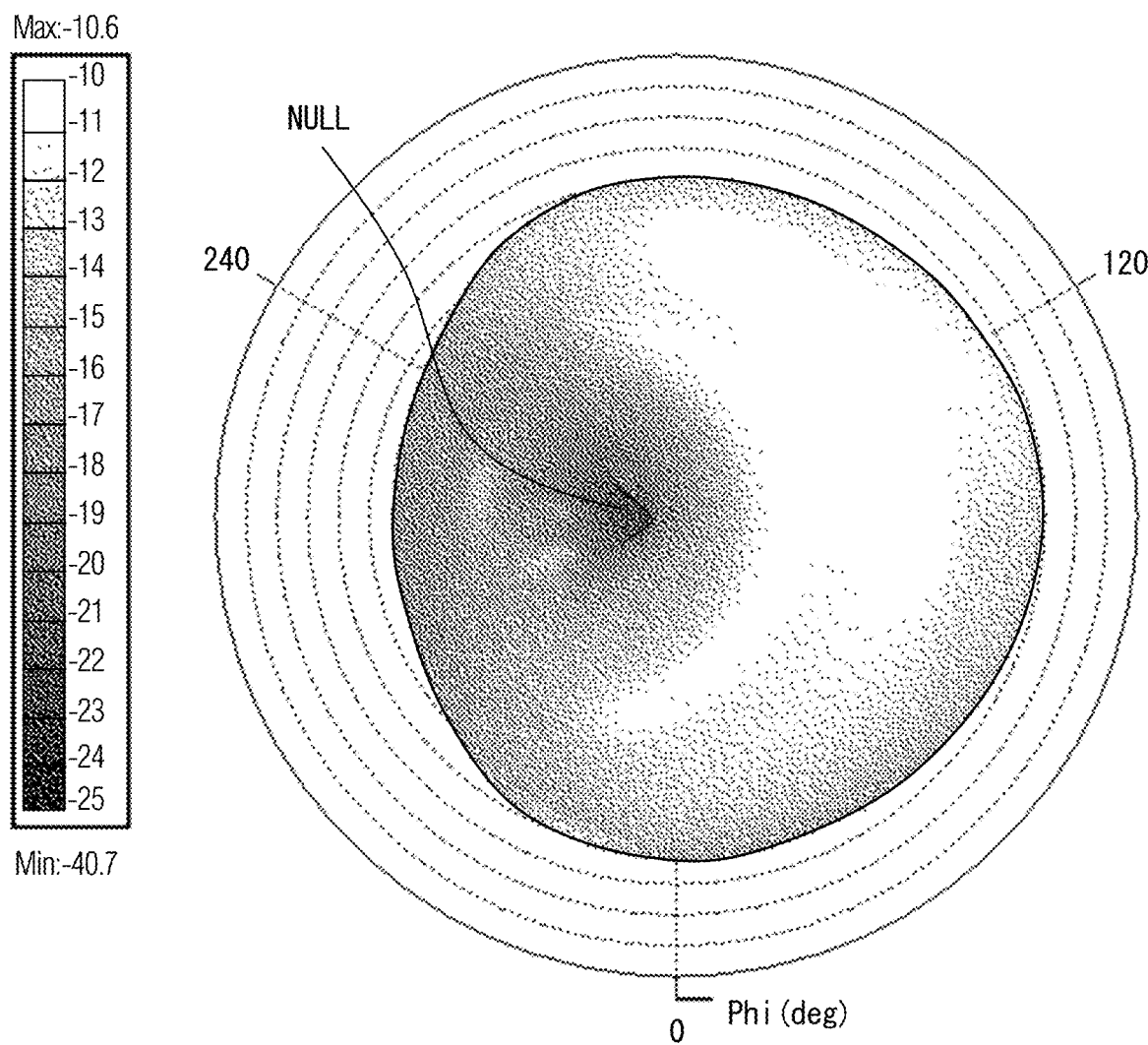
FIG. 7B is a diagram showing a radiation characteristic of the zeroth-order resonant antenna shown in FIG. 7A.

In FIG. 7A, the power supply line 70 extends in the Y direction. The power supply line 70 extends in the Y direction from one of sides of the opposing conductor 50 that is substantially parallel to the X direction. As shown in FIG. 7B, in the extension direction of the power supply line 70, the NULL is inclined to the side opposite to the power supply line 70, and the directivity is biased to the side where the power supply line 70 is arranged. The zeroth-order resonant antenna 20 shown in FIG. 7A has directivity in the extending direction of the power supply line 70.

Figure 8A:
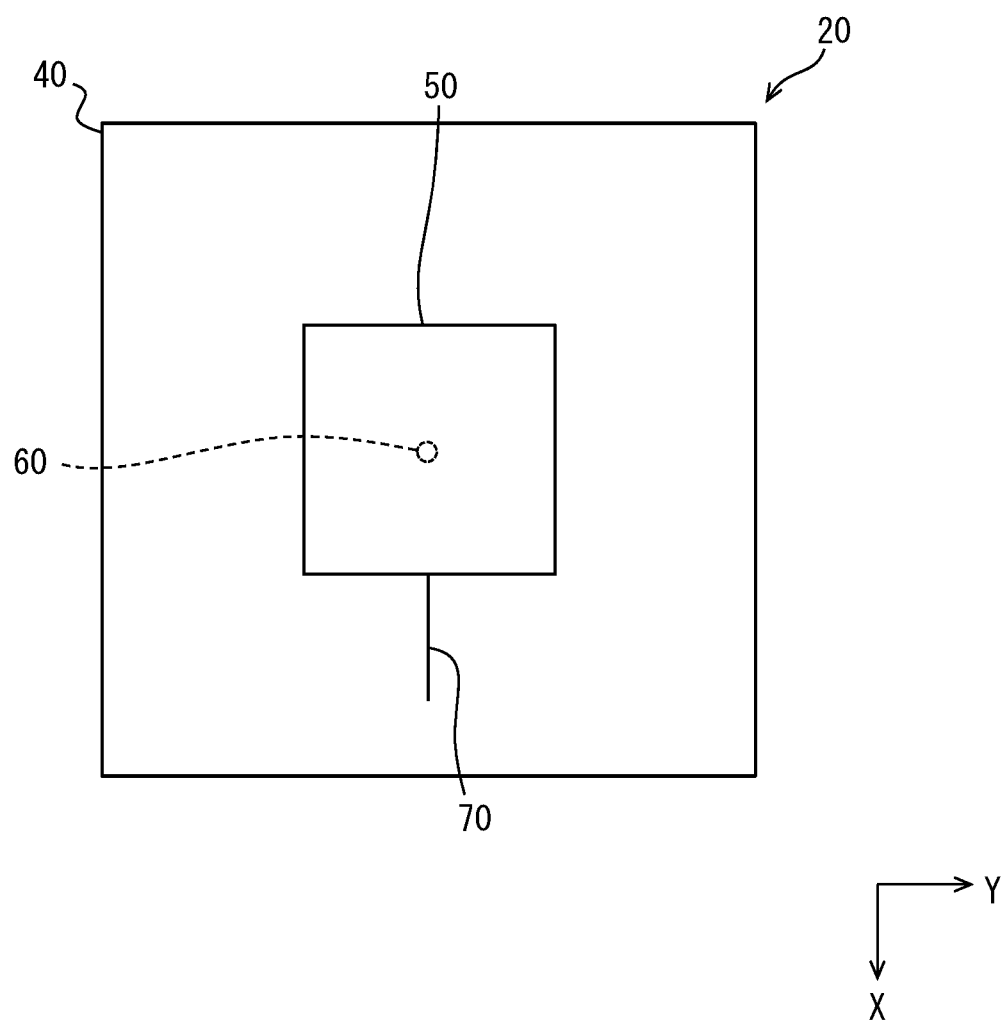
FIG. 8A is a diagram showing an extension direction of a power supply line in a zeroth-order resonant antenna.
Figure 8B:
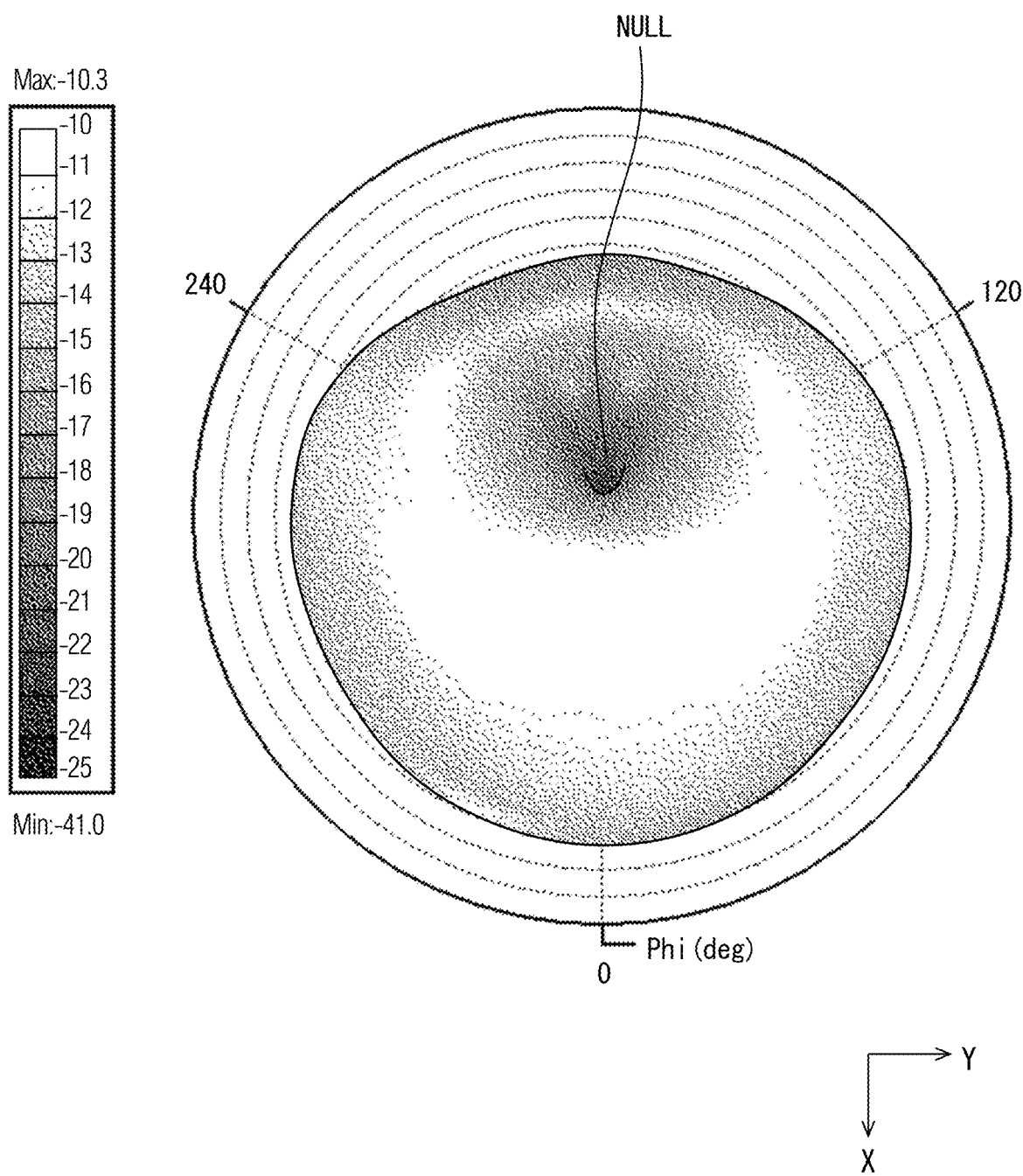
FIG. 8B is a diagram showing a radiation characteristic of the zeroth-order resonant antenna shown in FIG. 8A.

In FIG. 8A, the power supply line 70 extends in the X direction on the opposite side of the extension direction shown in FIG. 1. As shown in FIG. 8B, in the extension direction of the power supply line 70, the NULL is tilted to the side opposite to that in FIG. 6B, and the directivity is biased to the side where the power supply line 70 is arranged. The zeroth-order resonant antenna 20 shown in FIG. 8A has directivity in the extending direction of the power supply line 70, that is, in the direction opposite to that in FIG. 6B.

Figure 9A:
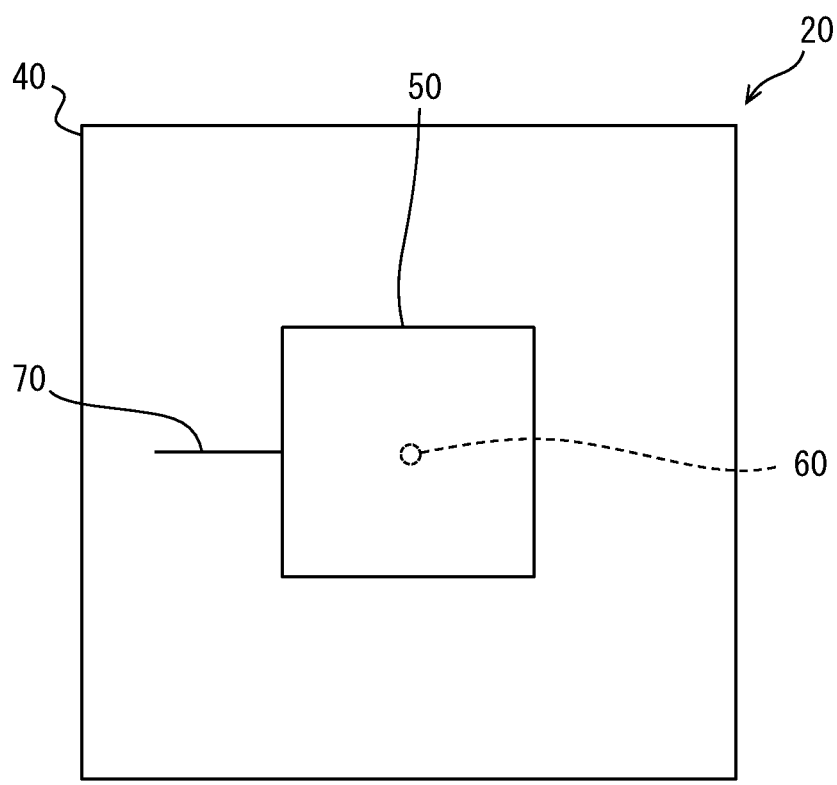
FIG. 9A is a diagram showing an extension direction of a power supply line in a zeroth-order resonant antenna.
Figure 9B:
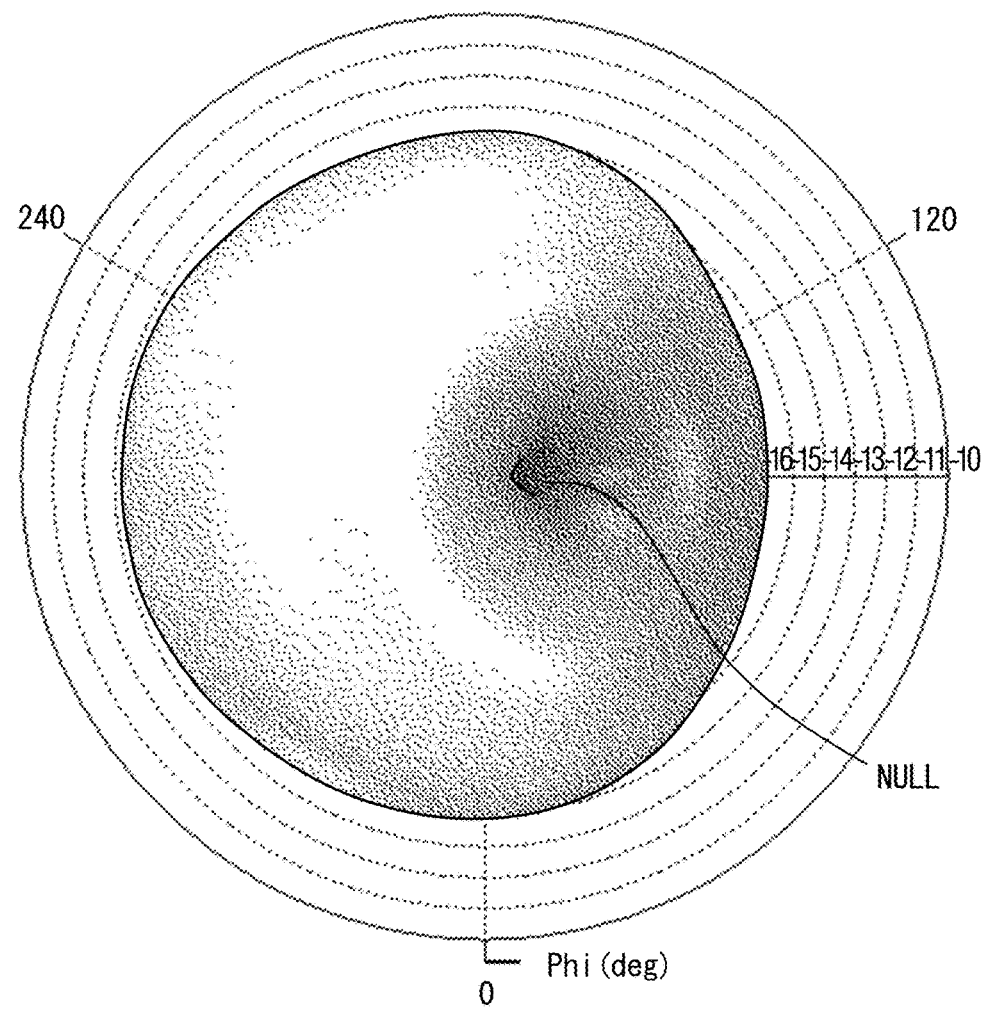
FIG. 9B is a diagram showing a radiation characteristic of the zeroth-order resonant antenna shown in FIG. 9A.

In FIG. 9A, the power supply line 70 extends in the Y direction on the opposite side of the extension direction shown in FIG. 7A. As shown in FIG. 9B, in the extension direction of the power supply line 70, the NULL is tilted to the side opposite to that in FIG. 7B, and the directivity is biased to the side where the power supply line 70 is arranged. The zeroth-order resonant antenna 20 shown in FIG. 9A has directivity in the extending direction of the power supply line 70, that is, in the direction opposite to that in FIG. 7B.

Figure 10A:
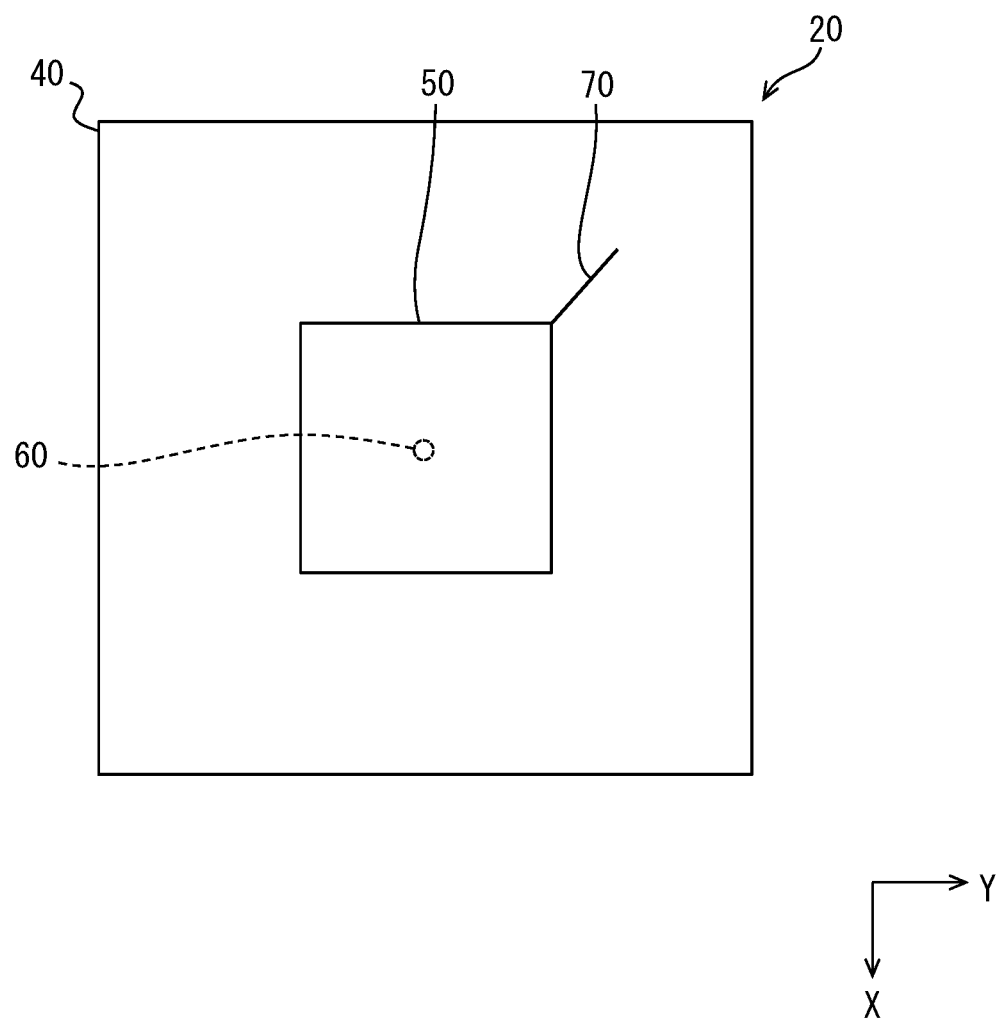
FIG. 10A is a diagram showing an extension direction of a power supply line in a zeroth-order resonant antenna.
Figure 10B:
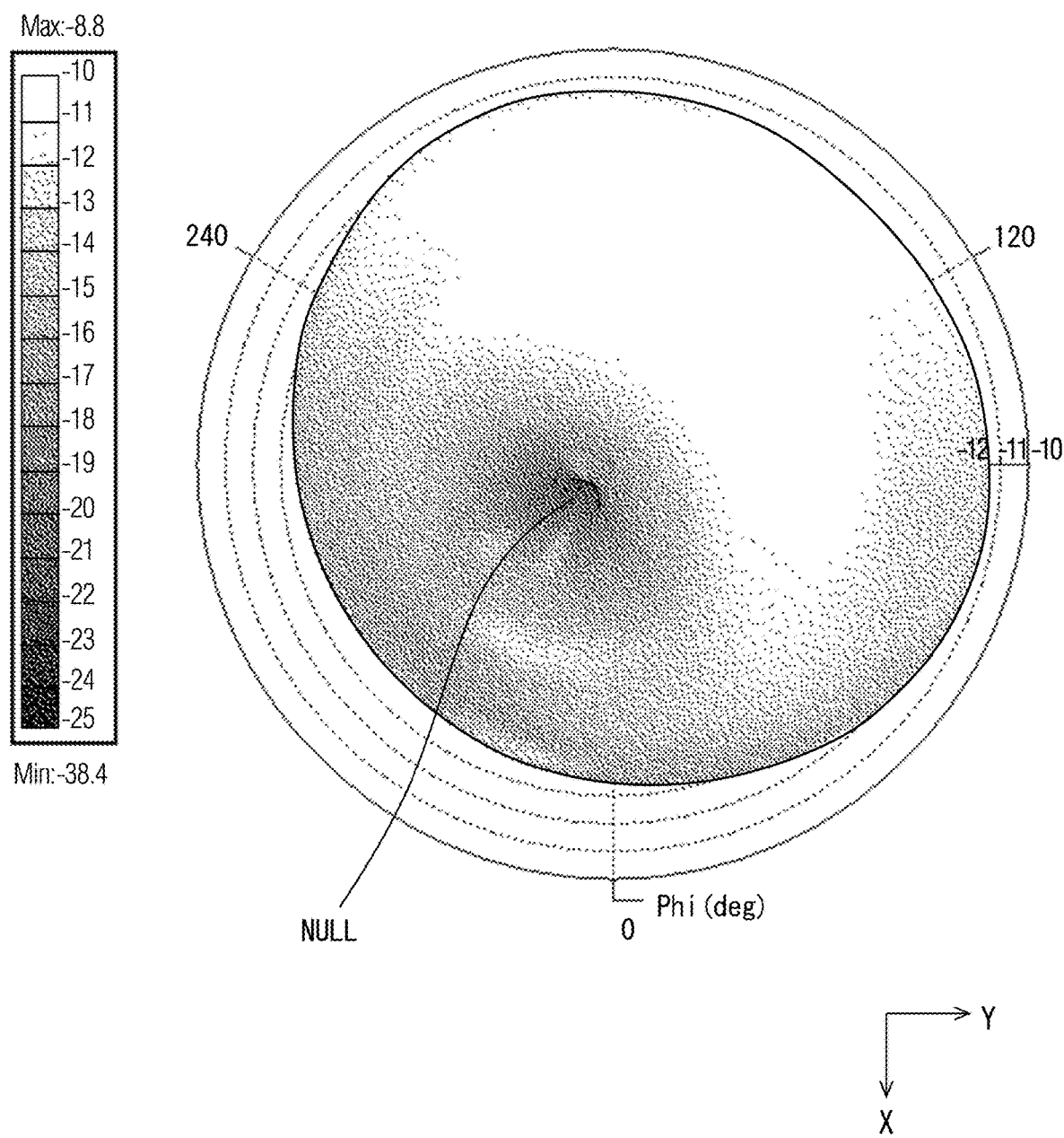
FIG. 10B is a diagram showing a radiation characteristic of the zeroth-order resonant antenna shown in FIG. 10A.

In FIG. 10A, the power supply line 70 extends diagonally. The power supply line 70 has an X-direction component and a Y-direction component. An angle formed by the power supply line 70 and a virtual line substantially parallel to the X direction and an angle formed by a virtual line substantially parallel to the Y direction are acute angles. The power supply line 70 extends from one of corners of the opposing conductor 50. As shown in FIG. 10B, in the extension direction of the power supply line 70, the NULL is inclined to the side opposite to the power supply line 70, and the directivity is biased to the side where the power supply line 70 is arranged. The zeroth-order resonant antenna 20 shown in FIG. 10A has directivity in the extending direction of the power supply line 70.

As shown in FIG. 6A to FIG. 10B, the zeroth-order resonant antenna, which originally has non-directivity in the XY plane, can be provided with directivity in a predetermined direction. The directivity of the zeroth-order resonant antenna 20 can be adjusted in the intended direction depending on the extending direction of the power supply line 70.

<Electronic Device>

Figure 11:
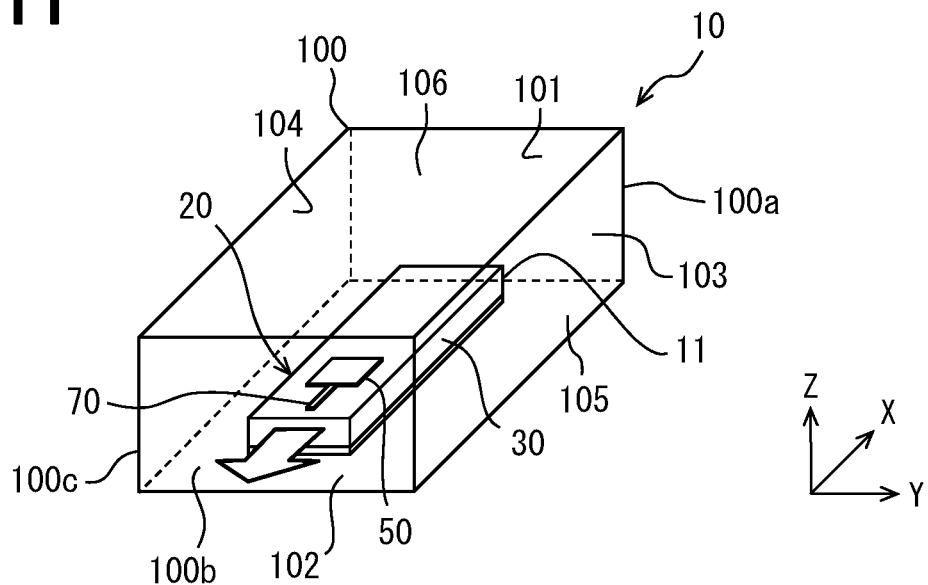
FIG. 11 is a transparent perspective view showing an electronic device according to the first embodiment.

Next, the electronic device 10 will be described with reference to FIG. 11. FIG. 11 is a transparent perspective view, and elements housed in a housing 100 are shown by solid lines. As shown in FIG. 11, the electronic device 10 includes the above-described zeroth-order resonant antenna 20 and the housing 100. The electronic device 10 is mounted on a moving body such as a vehicle. The electronic device 10 can perform wireless communication with another electronic device arranged in the moving body. The electronic device 10 of the present embodiment is configured to perform wireless communication with another electronic device arranged outside the housing 100.

The electronic device 10 is, for example, an antenna device that provides a wireless communication function, or an electronic control device (ECU) that has a wireless communication function. The electronic device 10 of the present embodiment is an electronic control device mounted on a vehicle. The electronic device 10 has a function of executing control related to the vehicle in addition to the wireless communication function.

As shown in FIG. 1, the power supply line 70 of the zeroth-order resonant antenna 20 extends in the X direction from the edge portion of the opposing conductor 50. The zeroth-order resonant antenna 20 is configured in a part of the base member 30. In another region of the base member 30, wiring (not shown) is arranged and electronic components are mounted to form a circuit. In the other region, the power supply circuit of the zeroth-order resonant antenna 20, a power source circuit, and a circuit for providing a control function are formed. The base member 30 is an insulating base member constituting a circuit board 11. The zeroth-order resonant antenna 20 is formed in a part of the circuit board 11.

The housing 100 houses other elements of the electronic device 10 including the zeroth-order resonant antenna 20. The housing 100 is configured so that at least a part of a wall defining an accommodation space transmits radio waves. In other words, a part of the wall is configured to reflect radio waves. The housing 100 is formed of, for example, a resin material and a metal material.

The housing 100 of the present embodiment has a substantially rectangular shape in a plane, and has four side walls 101 to 104, a lower wall 105, and an upper wall 106. The side walls 101 and 102 are walls in the X direction, and the side walls 103 and 104 are walls in the Y direction. At least a part of the side wall 102 close to the power supply line 70 with respect to the opposing conductor 50 is formed by using a resin material. The side walls 101, 103, 104 are formed using a metal material. The housing 100 is configured by assembling a resin cover 100b having the side wall 102 to a bottomed tubular metal case 100a having the side walls 101, 103, 104, the lower wall 105, and the upper wall 106. The entire resin cover 100b may be made of a resin material, or a metal member may be included in a part of the resin cover 100b by insert molding or the like.

<Summary of First Embodiment>

When the non-directional zeroth-order resonant antenna 20R shown in the reference example is applied to the electronic device 10 shown in FIG. 11, the reflection characteristic of the zeroth-order resonant antenna 20R are affected by the reflection by the metal portion of the housing 100.

The metal case 100a provides a small space in which the zeroth-order resonant antenna 20 is arranged. The metal case 100a has an opening 100c at one end in the X direction. Metal reflects radio waves. The metal case 100a is a metal body that limits the direction of radio wave propagation to the direction indicated by the white arrow, that is, a direction to the opening 100c. Radio waves are transmitted and/or received from the outside of the electronic device 10 through the opening 100c formed at the end of the metal body.

In the present embodiment, in the zeroth-order resonant antenna 20 arranged in the housing 100, the power supply line 70 extends in the direction from the edge portion of the opposing conductor 50 toward the opening 100c. Specifically, in a plan view, the power supply line 70 extends along a virtual straight line connecting the substantially center of the opposing conductor 50 and the substantially center of the width of the opening 100c in the Y direction. As a result, the zeroth-order resonant antenna 20 is not non-directional in the XY plane, but has directivity biased toward the opening 100c. For example, the zeroth-order resonant antenna 20 radiates radio waves mainly toward the opening 100c (resin cover 100b). Therefore, deterioration of the reflection characteristic due to the metal case 100a can be suppressed.

The extension direction of the power supply line 70 is not limited to the example of FIG. 11. The extension direction may be appropriately set according to the positional relationship with the opening 100c. As shown in FIG. 7A to FIG. 10B, directivity can be provided in the extending direction of the power supply line 70. According to the present embodiment, the extension direction of the power supply line 70 may be set in the direction from the opposing conductor 50 toward the opening 100c, so that the design of the zeroth-order resonant antenna 20 can be simplified.

The housing 100 whose propagation direction is restricted by the partial arrangement of the metal is not limited to the above example. For example, the housing 100 in which a metal film or the like is partially formed on the inner surface and/or the outer surface of the resin molded body may also be adopted.

Second Embodiment

The second embodiment is a modification of a preceding embodiment as a basic configuration and may incorporate description of the preceding embodiment. In the preceding embodiment, the opposing conductor 50 has a square shape. Instead of this, a slit may be provided in the opposing conductor 50.

Figure 12:
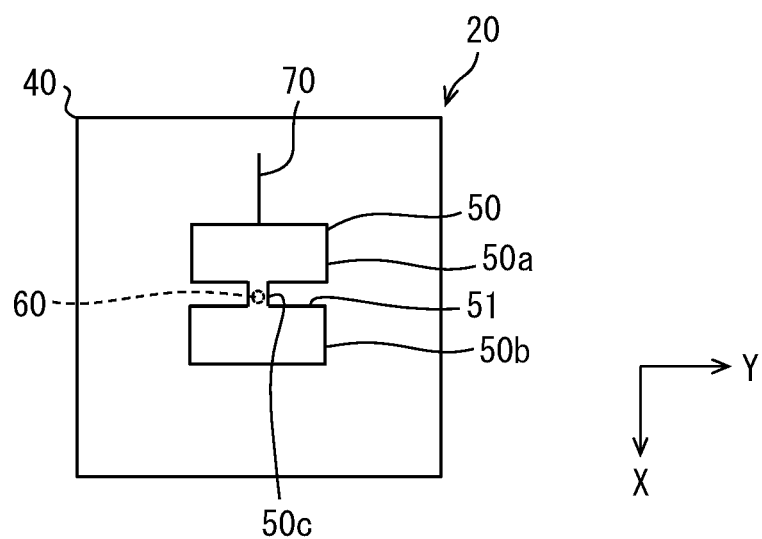
FIG. 12 is a plan view showing a zeroth-order resonant antenna in an electronic device according to a second embodiment.

FIG. 12 is a plan view showing a zeroth-order resonant antenna 20 in an electronic device 10 of the present embodiment. In FIG. 12, for convenience, the base member 30 is omitted. As shown in FIG. 12, at least one slit 51 is provided in the opposing conductor 50. The slit 51 has a predetermined depth in the Z direction and opens at an edge of the opposing conductor 50.

The slit 51 of the present embodiment penetrates the opposing conductor 50 in the Z direction. The opposing conductor 50 has two slits 51. The two slits 51 are provided so that the opposing conductor 50 has two-fold symmetry around the Z axis. The two slits 51 are provided so as to sandwich the short-circuit portion 60, in other words, the substantially center of the opposing conductor 50 in the Y direction in a plan view. The slits 51 are open on two opposite sides to which the power supply line 70 is not connected.

The extension length and width of the two slits 51 are equal to each other. The slits 51 divide the opposing conductor 50 into a first opposing portion 50a and a second opposing portion 50b. The first opposing portion 50a and the second opposing portion 50b have the same shape and area. The portion sandwiched by the two slits 51 forms a connecting portion 50c that connects the first opposing portion 50a and the second opposing portion 50b. The opposing conductor 50 includes the first opposing portion 50a, the second opposing portion 50b, and the connecting portion 50c. The extension length of the slits 51 are longer than the length of the connecting portion 50c in the Y direction, and the width of the slit 51 is shorter than widths of the first opposing portion 50a and the second opposing portion 50b. The opposing conductor 50 forms a substantially square plane in which portions of the slits 51 are removed from the square shape.

Figure 13:
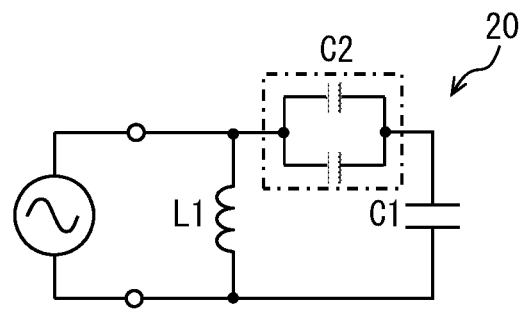
FIG. 13 is an equivalent circuit diagram of the zeroth-order resonant antenna.

FIG. 13 is an equivalent circuit diagram of the zeroth-order resonant antenna 20. In FIG. 13, for convenience, some circuit elements, for example, an inductor included in the opposing conductor 50, are omitted. As shown in FIG. 13, the zeroth-order resonant antenna 20 has a parallel resonance structure of an inductor L1 included in the short-circuit portion 60 and a capacitor C1 formed between the ground plate 40 and the opposing conductor 50. By providing the slits 51, a capacitor C2 is formed between the first opposing portion 50a and the second opposing portion 50b. The capacitor C2 is a parallel circuit of capacitors formed in each of the two slits 51. The capacitor C2 is connected in series with the capacitor C1.

<Summary of Second Embodiment>

In the present embodiment, by providing the slits 51 in the opposing conductor 50, the area of the opposing conductor 50 is reduced, and the capacitance of the capacitor C1 is reduced. On the other hand, due to the slit 51, the capacitor C2 is connected in series with the capacitor C1. Accordingly, the number of variables that determine the overall capacitance increases. The capacitance of the capacitor C2 can be set by, for example, at least one of the extension length, width, and depth of the slits 51.

By providing the capacitor C2 in this way, the degree of freedom in designing the zeroth-order resonant antenna 20 is improved. Therefore, the reflection characteristic can be improved as compared with the configuration having no slit 51. In addition, the opposing conductor 50 can be miniaturized. By miniaturization, for example, in a circuit board, the degree of freedom in arranging the opposing conductor 50 can be improved. Specifically, the opposing conductor 50 can be disposed in a narrower space.

The shape, size, arrangement, and number of slits 51 are not limited to the above examples. For example, the positions of the two slits 51 may be shifted from each other. The slits 51 may be provided so as to open on a side substantially parallel to the Y direction. Only one slit 51 may be provided, or three or more slits 51 may be provided. The slit 51 is not limited to a straight line. For example, a slit 51 having a substantially L-shaped in a plan view may be adopted. As described above, when the slits 51 are provided so that the opposing conductor 50 has two-fold symmetry, the bias of the electric field distribution can be suppressed. The zeroth-order resonant antenna 20 having the configuration shown in FIG. 12 has a radiation characteristic, that is, directivity in the X direction, which is the extension direction of the power supply line 70 in a manner similar to the configuration shown in FIG. 1 of the preceding embodiment.

In the above-described example, the slits 51 penetrate the opposing conductor 50 in the Z direction. But the structures of the slits 51 are not limited to the above-described example. The slits 51 may have groove shapes provided halfway through the depth of the opposing conductor 50. Even in such a structure, the capacitor C2 is formed between opposing surfaces of the first opposing portion 50a and the second opposing portion 50b.

As described in the preceding embodiment, the planar shape of the opposing conductor 50 is not limited to the square shape. The slits 51 can also be combined with the opposing conductor 50 having a shape different from the square shape.

Third Embodiment

The third embodiment is a modification of the preceding embodiments as a basic configuration and may incorporate the description of the preceding embodiments. In the preceding embodiments, an example of performing wireless communication with the outside of the housing has been described. Instead of this, the present disclosure may be applied to a configuration in which wireless communication is performed inside the housing.

An electronic device 10 of the present embodiment is a battery module applied to an electric vehicle such as an electric vehicle and a plug-in hybrid vehicle. The electronic device 10 constitutes an in-vehicle power supply. The electronic device 10 supplies electric power to an electric load of a vehicle. The battery module is sometimes referred to as a battery pack. In the vehicle, the electronic device 10 may be arranged, for example, in a space under a front seat, a space under a rear seat, a space between the rear seat and a trunk room, and the like.

<Battery Module>

Figure 14:
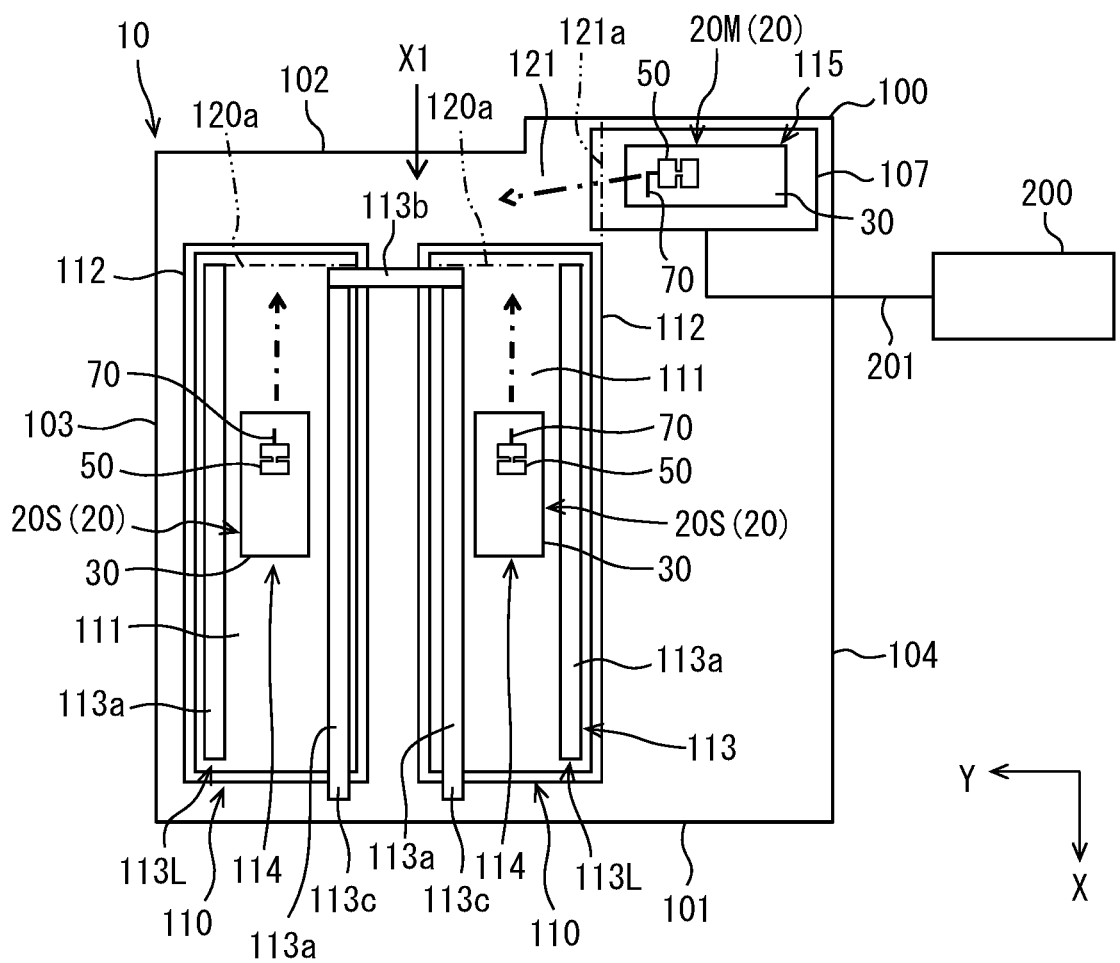
FIG. 14 is a plan view showing an electronic device according to a third embodiment.
Figure 15:
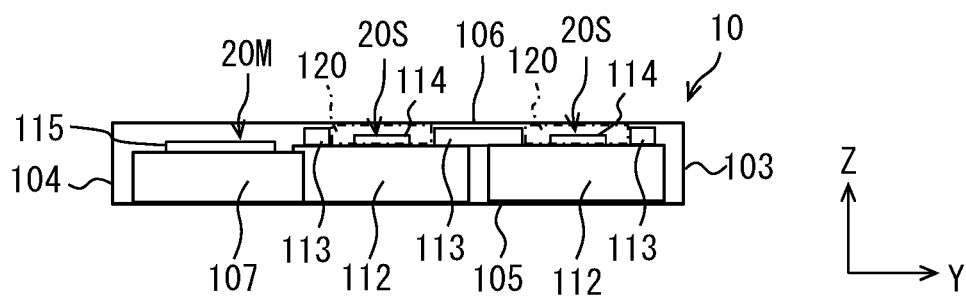
FIG. 15 is a side view of the electronic device seen from an X1 direction shown in FIG. 14.

First, a schematic configuration of the battery module (electronic device 10) will be described with reference to FIG. 14 and FIG. 15. In FIG. 14, for convenience, elements inside a housing 100 are shown by solid lines. FIG. 15 is a side view of FIG. 14 as viewed from an X1 direction.

The electronic device 10 (battery module) includes the housing 100, a plurality of battery stacks 110, a plurality of individual monitors 114, and an integrated monitor 115. The housing 100 is a metal housing formed of a metal such as aluminum. All walls, that is, side walls 101-104, a lower wall 105, and an upper wall 106 are made of metal. The housing 100 houses the battery stack 110, the individual monitor 114, and the integrated monitor 115. The housing 100 has a substantially rectangular shape in a plan view.

The electronic device 10 includes two battery stacks 110. Each of the battery stack 110 has a plurality of battery cells 111, a battery case 112, and a plurality of bus bars 113. The battery case 112 houses the battery cells 111. The battery case 112 is formed of, for example, metal. The battery case 112 has a box shape whose one surface is open. The battery case 112 has a substantially rectangular shape in a plan view and is open on one side in the Z direction.

Each of the battery cells 111 is a secondary battery that generates an electromotive voltage by a chemical reaction. As the secondary battery, for example, a lithium ion secondary battery can be adopted. The battery cells 111 are stacked and arranged in a direction orthogonal to the Z direction. In the present embodiment, the battery cells 111 are stacked in the X direction. Each of the battery cells 111 has electrode terminals (not shown) near both ends in the Y direction on the upper surface. In FIG. 14, for convenience, the battery cells 111 housed in the battery case 112 are integrally shown.

Each of the bus bars 113 is a plate-shaped metal member made of copper or the like. Each of the bus bars 113 is connected to the electrode terminals of the battery cells 111. The bus bars 113 include bus bars 113a, 113b, and 113c. Most of the bus bars 113 are the bus bars 113a. Each of the bus bars 113a electrically connects the electrode terminals of two adjacent battery cells 111 in the X direction. The battery cells 111 housed in the common battery case 112 are electrically connected in series by the bus bars 113a to form one assembled battery. Although a gap is provided between the adjacent bus bars 113a in the X direction, the bus bars 113a are integrally shown in FIG. 14 for convenience.

The bus bar 113b electrically connects the battery cells 111 of different battery stacks 110. The bus bar 113b of the present embodiment electrically connects the battery cells 111 arranged at ends close to the side wall 102 in the two battery stacks 110 adjacent to each other in the Y direction. The assembled batteries included in each of the battery stacks 110 are electrically connected in series by the bus bar 113b. The bus bar 113b is a common bus bar 113 in the two battery stacks 110.

The bus bars 113c are electrically connected to power lines (positive electrode line, negative electrode line) which are not shown. The bus bars 113c also extend in the X direction. The power lines, which are not shown, are connected to the battery stack 110 having the highest potential and the battery stack 110 having the lowest potential via the bus bars 113c, respectively. In the present embodiment, one of the battery stacks 110 is the highest potential battery stack, and the other one of the battery stacks 110 is the lowest potential battery stack. The bus bars 113c are respectively connected to the battery cells 111 arranged at ends near the side wall 101 of the two battery stacks 110. A gap is provided between the adjacent bus bars 113a and 113c in the X direction, but in FIG. 14, the bus bars 113a and 113c are integrally shown for convenience.

Each of the battery stacks 110 has a substantially planar shape with the X direction, which is the stacking direction of the battery cells 111, as the longitudinal direction and the Y direction as the lateral direction. The battery stacks 110 are fixed to, for example, the lower wall 105 of the housing 100. The two battery stacks 110 are arranged side by side in the Y direction, which is the lateral direction. One of the battery stacks 110 is arranged near the side wall 103 in the Y direction. In the Y direction, one end of each of the battery stacks 110 is located near the side wall 101, and the other end is located near the side wall 102.

The individual monitors 114 are provided for the respective battery stacks 110. The individual monitors 114 have function of acquiring physical quantities of the battery cells 111 and outputting the physical quantities to the integrated monitor 115. The individual monitors 114 have a function of executing equalization processing. The individual monitors 114 are respectively arranged on the corresponding battery stacks 110.

The electronic device 10 includes a sensor (not shown) that detects the physical quantity of each of the battery cells 111. Examples of the sensor include a voltage sensor, a temperature sensor, and a current sensor. The voltage sensor detects an output voltage of each of the battery cells 111. The temperature sensor detects the temperature of at least one of the battery cells 111. The current sensor detects an electric current flowing in common to the battery cells 111 connected in series.

Each of the individual monitors 114 acquires the detection result of the sensor, assigns an identification code for identifying which battery stack 110 to the acquired detection result, and generates a monitoring signal. Each of the individual monitor 114 includes the zeroth-order resonant antenna 20 and the power supply circuit, that is, the wireless device described in the preceding embodiments. In the following, the zeroth-order resonant antenna 20 included in each of the individual monitors 114 may be referred to as a zeroth-order resonant antenna 20S. The monitoring signal is modulated in the power supply circuit, and is radiated (transmitted) from the zeroth-order resonant antenna 20S to the accommodation space of the housing 100 as a radio wave on which the signal is placed. The two individual monitors 114 respectively transmit the monitoring signals for the corresponding battery stacks 110. The individual monitors 114 correspond to second wireless devices.

The integrated monitor 115 also includes the zeroth-order resonant antenna 20 and the power supply circuit. In the following, the zeroth-order resonant antenna 20 included in the integrated monitor 115 may be referred to as a zeroth-order resonant antenna 20M. The zeroth-order resonant antenna 20M receives the radio waves radiated by each of the zeroth-order resonant antennas 20S. The radio waves are demodulated in the power supply circuit and converted into digital signals. In this way, the integrated monitor 115 converts the radio waves output from the individual monitors 114 into digital signals. The integrated monitor 115 corresponds to a first wireless device. The integrated monitor 115 outputs the converted digital signals to a battery ECU 200. The integrated monitor 115 and the battery ECU 200 are configured to be capable of communicating with each other via a bus line 201.

The integrated monitor 115 is arranged side by side with the battery stack 110 in the Y direction. The integrated monitor 115 is arranged near the corner of the side walls 102 and 104. The integrated monitor 115 is fixed to the lower wall 105 of the housing 100 via, for example, a support member 107.

The battery ECU 200 calculates a state of charge (SOC) of the electronic device 10 (battery module) based on the digital signal that is input. The battery ECU 200 determines a state of charge or discharge of the electronic device 10 based on the detected SOC and in-vehicle information input from other in-vehicle ECU, an in-vehicle sensor, and the like.

Further, the battery ECU 200 calculates the SOC of each of the battery cells 111 included in each of the battery stacks 110. Then, the battery ECU 200 determines whether an SOC equalization process of each of the battery cells 111 can be executed. The battery ECU 200 outputs an instruction signal based on the determination of the equalization process to the integrated monitor 115.

The integrated monitor 115 radiates the input instruction signal into the accommodation space of the housing 100 via the zeroth-order resonant antenna 20M. This instruction signal includes the above-described identification code. Therefore, in the individual monitors 114, only the individual monitor 114 corresponding to the identification code receives this radio wave. The individual monitor 114 includes a switch element (not shown) for individually charging and discharging each of the battery cells 111. The individual monitor 114 controls the drive of the switch element based on the instruction signal. Accordingly, the battery cells 111 are individually charged and discharged. As a result, the SOCs of the plurality of battery cells 111 are equalized.

<Zeroth-Order Resonant Antenna and Directivity>

Figure 16A:
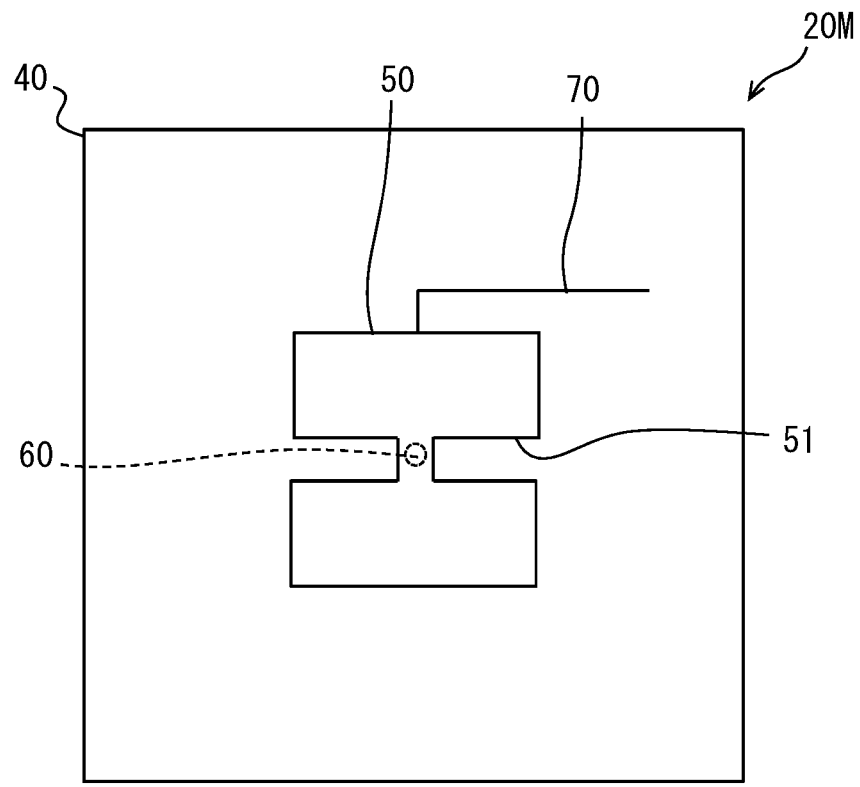
FIG. 16A is a diagram showing an extension direction of a power supply line in a zeroth-order resonant antenna.
Figure 16A:
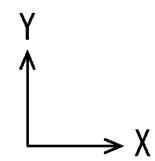
Figure 16B:
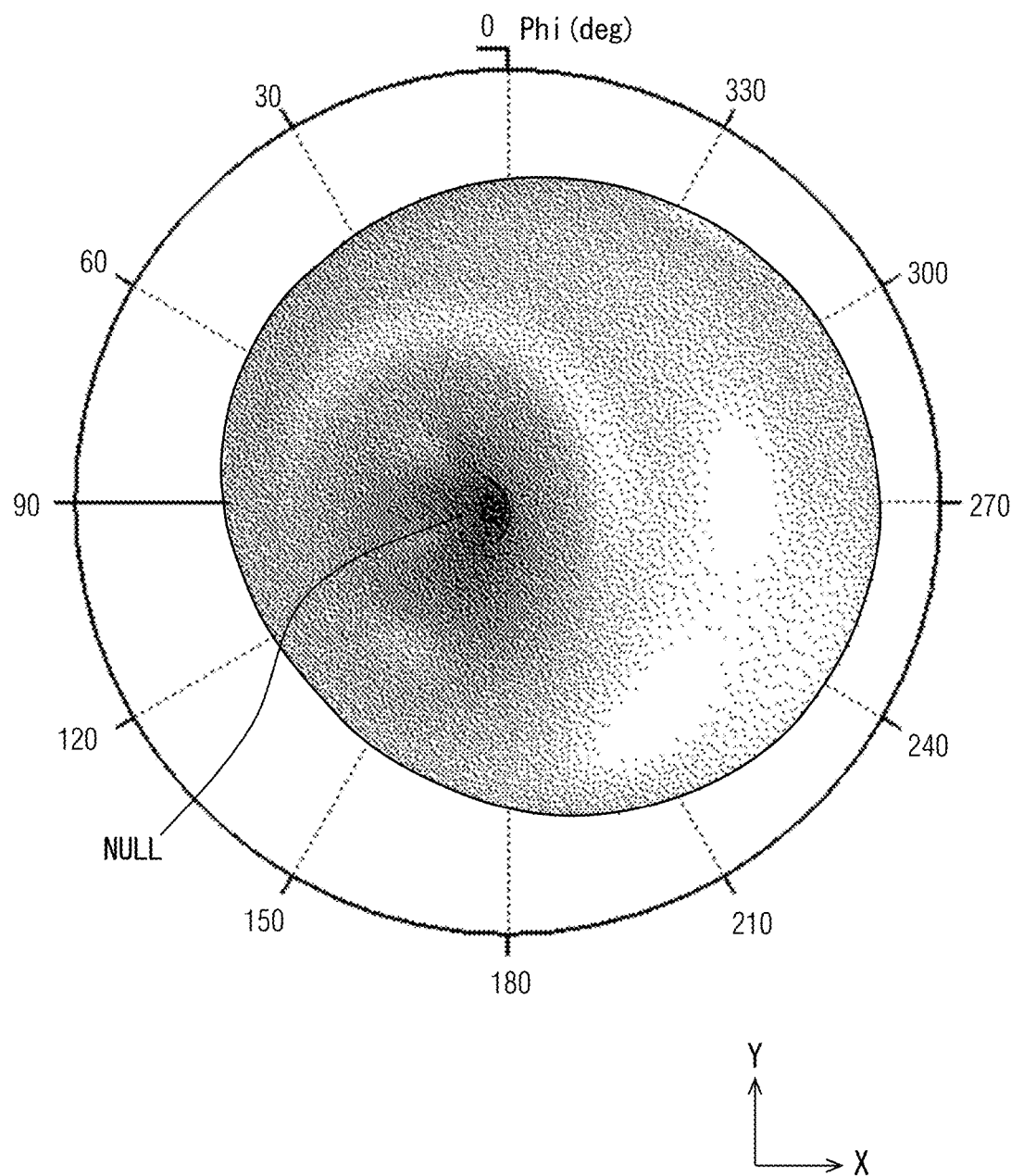
FIG. 16B is a diagram showing a radiation characteristic of the zeroth-order resonant antenna shown in FIG. 16B.

The arrangement and directivity of the zeroth-order resonant antennas 20M and 20S will be described with reference to FIG. 14 to FIG. 16B. FIG. 16A and FIG. 16B are diagrams showing the relationship between the extension direction of the power supply line 70 of the zeroth-order resonant antenna 20M and the radiation characteristic.

In the battery stack 110, the bus bars 113 are arranged so that radio waves of operating frequencies do not leak from portions adjacent to each other in the X direction. A bus bar row 113L in which bus bars 113 are arranged in the X direction behaves as one metal body electromagnetically. Therefore, the bus bar row 113L (bus bar 113) limits the direction of radio wave propagation.

Each of the battery stacks 110 includes two bus bar rows 113L. The zeroth-order resonant antenna 20S is arranged between the bus bar rows 113L on the upper surface of the corresponding battery stack 110. The bus bar row 113L (bus bar 113) corresponds to a metal body and a metal member housed in a housing.

In this way, the bus bar rows 113L (bus bars 113) are arranged on both sides of the zeroth-order resonant antenna 20S in the Y direction so as to sandwich the zeroth-order resonant antenna 20S. The individual monitor 114 including the zeroth-order resonant antenna 20S is arranged on the upper surface of the battery stack 110. The height of the electronic device 10 in the Z direction is low. In the low-profile electronic device 10, the distance between the zeroth-order resonant antenna 20S and the upper wall 106 of the housing 100 is narrow. The zeroth-order resonant antenna 20S is arranged in a space 120 formed by the housing 100 (upper wall 106) and the two bus bar rows 113L (bus bar 113). In FIG. 15, a region surrounded by a dashed dotted line is the space 120. The space 120 extends in the X direction along the bus bar rows 113L. The X-direction corresponds to a first direction.

In the space 120, the direction of radio wave propagation is restricted by the metal body including the bus bar rows 113L and the housing 100. Specifically, the direction of radio wave propagation is limited to an end of the space 120. The metal body has an opening 120a, which is one of the ends of the space 120. The opening 120a is formed at ends of the bus bar rows 113L (bus bar 113) in the extending direction, specifically, at the ends close to the side wall 102. In FIG. 14, the opening 120a is indicated by the dashed double-dotted line.

The zeroth-order resonant antenna 20S has a configuration same as that the configuration of the second embodiment. The opposing conductor 50 has the substantially square shape provided with the slits 51. The power supply line 70 extends from the edge of the opposing conductor 50 in the direction toward the opening 120a. Specifically, in a plan view, the power supply line 70 extends along a virtual straight line connecting the substantially center of the opposing conductor 50 and the substantially center of the width of the opening 120a in the Y direction. The extension direction of the power supply line 70 is substantially parallel to the X direction. Accordingly, each of the zeroth-order resonant antennas 20S has directivity in the direction toward the opening 120a. The arrow of the dashed dotted line shown in FIG. 14 indicates the direction of directivity of the zeroth-order resonant antenna 20S.

For example, the radio wave radiated from the zeroth-order resonant antenna 20S propagates in the space 120 in the direction indicated by the arrow of the dashed dotted line in FIG. 14, and is radiated to the outside from the opening 120a. Since the radio wave is reflected by the side walls 102 and 103, the radio wave radiated from the opening 120a propagates through the gap (space) between the battery stack 110 and the side wall 102 toward the side wall 104, and is received by the zeroth-order resonant antenna 20M.

In the Y direction, the battery case 112 and the bus bar rows 113L, which are metal bodies, are arranged between the integrated monitor 115, that is, the zeroth-order resonant antenna 20M and the zeroth-order resonant antenna 20S. Accordingly, the propagation direction of radio wave is restricted. The Y direction corresponds to a second direction. For example, a gap is provided between the end surface of the metal body (battery case 112) closest to the zeroth-order resonant antenna 20M in the Y direction and the side wall 102. In this way, the battery case 112 and the housing 100 including the side wall 102 form a space 121 capable of propagating radio waves.

The space 121 extends in the Y direction along the end face of the battery case 112. In the space 121, the propagation direction of radio wave is restricted by the metal bodies including the battery case 112 and the housing 100. Specifically, the propagation direction of radio wave is limited to an end of the space 121. The metal body has an opening 121a, which is one of the ends of the space 121. The opening 121a is provided at the end of the side surface of the battery case 112 close to the side wall 104. In FIG. 14, the opening 121a is indicated by the dashed double-dotted line.

As shown in FIG. 14 and FIG. 16A, the zeroth-order resonant antenna 20M includes the opposing conductor 50 having the substantially square shape provided with the slits 51 in a manner similar to the zeroth-order resonant antenna 20S. The power supply line 70 extends from the edge of the opposing conductor 50 in the direction toward the opening 121a. The zeroth-order resonant antenna 20M is arranged closer to the side wall 104 than the two zeroth-order resonant antennas 20S. In a plan view, the substantially center of the opposing conductor 50 and the substantially center of the width of the opening 121a are deviated in the X direction. Therefore, the power supply line 70 extends so as to have both X-direction component and Y-direction component. The power supply line 70 has an X-direction extension portion and a Y-direction extension portion, and the combination of the X-direction extension portion and the Y-direction extension portion extends in the direction of the opening 121a.

The power supply line 70 has a substantially L-shaped in a plan view. The power supply line 70 extends from the edge of the opposing conductor 50 toward the side wall 103 in the Y direction, and extends toward the side wall 101 in the X direction on the way. Accordingly, the zeroth-order resonant antenna 20M has an oblique directivity having an X-direction component and a Y-direction component, as shown in FIG. 16B. The arrow of the dashed double-dotted line shown in FIG. 14 indicates the direction of directivity of the zeroth-order resonant antenna 20M. The NULL is tilted to the opposite side of the power supply line 70. The zeroth-order resonant antenna 20M has a directivity biased toward the opening 121a.

For example, the radio wave radiated from the zeroth-order resonant antenna 20M propagates in the direction indicated by the arrow of the dashed double-dotted line in FIG. 14, and propagates through the opening 121a to the gap (space) between the battery stack 110 and the side wall 102. The radio wave propagates in the space 120 connected to this gap and is received by the zeroth-order resonant antenna 20S.

<Summary of Third Embodiment>

When the above-described non-directional zeroth-order resonant antenna 20R is used, the reflection characteristics of both the individual monitor 114 and the integrated monitor 115 deteriorate due to the influence of the reflection by the housing 100 made of metal.

In the present embodiment, in each of the zeroth-order resonant antennas 20M and 20S, the power supply line 70 extends in the direction from the opposing conductor 50 toward the opening of the metal body. Accordingly, the zeroth-order resonant antennas 20M and 20S have directivity biased toward the corresponding opening. Therefore, in a configuration in which a plurality of wireless devices perform wireless communication in the housing 100 made of metal, deterioration of the reflection characteristics can be suppressed.

In the present embodiment, the zeroth-order resonant antenna 20S of the individual monitor 114 is arranged in the space 120 defined by the bus bar rows 113L (bus bar 113) and the housing 100 (upper wall 106). In this configuration, the power supply line 70 of the zeroth-order resonant antenna 20S extends in the direction from the opposing conductor 50 toward the opening 120a. Accordingly, the zeroth-order resonant antenna 20S has directivity in the direction of the opening 120a. Therefore, a deterioration of the reflection characteristic of the zeroth-order resonant antenna 20S can be suppressed.

In the present embodiment, the battery case 112 and the bus bar rows 113L (bus bar 113), which are metal bodies, are arranged between the zeroth-order resonant antenna 20M of the integrated monitor 115 and the zeroth-order resonant antenna 20S, and the radio wave propagation direction is limited. In this configuration, the power supply line 70 of the zeroth-order resonant antenna 20M extends toward the opening 121a formed by providing an opening to the battery case 112 (metal body). Accordingly, the zeroth-order resonant antenna 20M has directivity in the direction of the opening 121a. Therefore, a deterioration of the reflection characteristic of the zeroth-order resonant antenna 20M can be suppressed.

As in the preceding embodiment (see FIG. 10A), the zeroth-order resonant antenna 20M may be provided with directivity in the oblique direction by extending the power supply line 70 in the oblique direction from a corner portion of the opposing conductor 50. In this case, the power supply line 70 may be provided so as to be along a virtual straight line connecting the substantially center of the opposing conductor 50 and the substantially center of the width of the opening 121a in a plan view. However, when the power supply line 70 is provided so as to have an X-direction extension portion and a Y-direction extension portion as in the present embodiment, the degree of freedom in design is improved. For example, power can be supplied even when the power supply line 70 cannot be extended in an oblique direction due to power supply. The directivity can be adjusted by balancing the lengths of the X-direction extension portion and the Y-direction extension portion.

The configuration of the electronic device 10 (battery module) is not limited to the above example. For example, the number of battery stacks 110, the arrangement of battery stacks 110, the number of battery cells 111, the electrical connection structure of battery cells 111, and the like are not limited to the above example. The number of individual monitors 114 is also not limited to the above example.

An example in which the opposing conductor 50 is provided with the slits 51 has been described, but the opposing conductor 50 may have a different structure. The zeroth-order resonant antenna 20 without the slit 51 shown in the first embodiment may also be adopted.

An example in which the electronic device 10 is applied to the battery module has been described, but the application of the present disclosure is limited to the battery module. The present disclosure can be applied to any electronic device having a configuration in which wireless communication is performed in the housing 100 made of metal. Further, an example in which the bus bar rows 113L including the bus bars 113 arranged side by side has been described as metal members arranged in the housing 100 made of metal, the metal member is not limited to the bus bar row 113L. The metal member may be composed of one member. Further, a metal case, a wiring member, or the like of an electronic component arranged in the housing 100 may be used as metal members.

Fourth Embodiment

The fourth embodiment is a modification of the preceding embodiments as a basic configuration and may incorporate the description of the preceding embodiments. In the preceding embodiments, each of the zeroth-order resonant antennas 20 has only one power supply line. The zeroth-order resonant antenna 20 may have a plurality of power supply lines.

Figure 17:
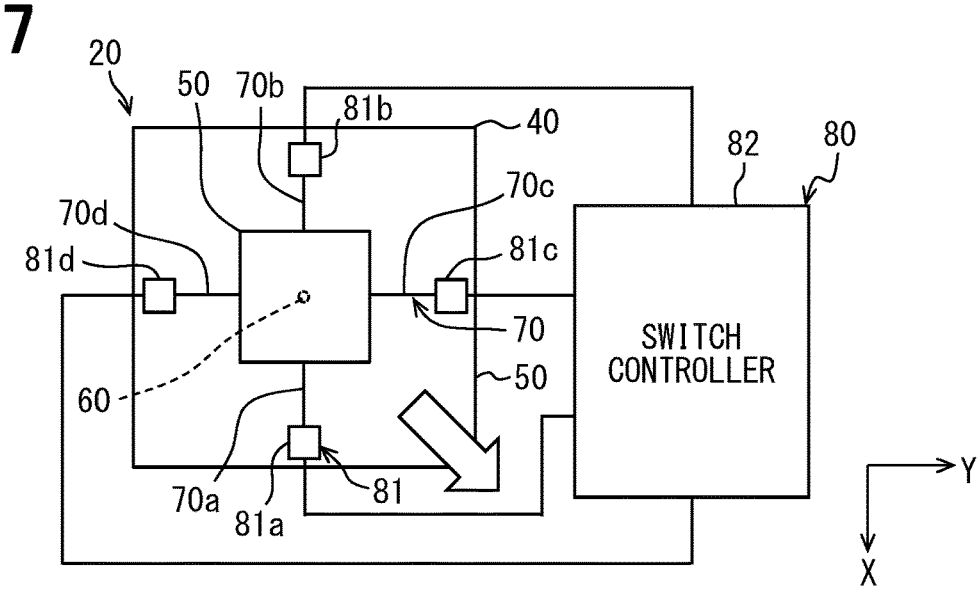
FIG. 17 is a diagram showing a zeroth-order resonant antenna in an electronic device according to a fourth embodiment.

FIG. 17 shows the zeroth-order resonant antenna 20 of the present embodiment. Also in FIG. 17, for convenience, the base member 30 is omitted. The zeroth-order resonant antenna 20 has a plurality of power supply lines 70. In a plan view, the plurality of power supply lines 70 extend from different positions on the edges of the opposing conductors 50 in different directions so as to surround the opposing conductors 50.

Specifically, the power supply line 70 include four power supply lines 70a, 70b, 70c and 70d. Each of the power supply lines 70 extends along a virtual straight line connecting the substantially center of the opposing conductor 50 and the substantially center of each side of the square shape. The power supply line 70*a* extends in the X direction from one of the sides substantially parallel to the Y direction, and the power supply line 70*b* extends from the opposite side in the Y direction to the side opposite to the power supply line 70*a*. The power supply line 70*c* extends in the Y direction from one of the sides substantially parallel to the X direction, and the power supply line 70*d* extends from the opposite side in the X direction to the side opposite to the power supply line 70*c*. The plurality of power supply lines 70 are arranged radially.

The zeroth-order resonant antenna 20 further includes a power supply controller 80. The configuration excluding the number of power supply lines 70 and the power supply controller 80 is the same as that of the zeroth-order resonant antenna 20 described in the preceding embodiment. The power supply controller 80 controls power supply to the plurality of power supply lines 70. The power supply controller 80 includes a plurality of switches 81 and a switch controller 82. Each of the switches 81 switches a connection state between the corresponding power supply line 70 and the power supply circuit to conduction or disconnection. When each of the switches 81 is turned on, the corresponding power supply line 70 becomes conductive with the power supply circuit, and an electric current is input from the power supply circuit to the corresponding power supply line 70. When each of the switches 81 is turned off, the power supply from the power supply circuit to the corresponding power supply line 70 is cut off.

The switches 81 are provided for the power supply lines 70, respectively. The power supply controller 80 has switches 81*a*, 81*b*, 81*c*, and 81*d*. The switch 81*a* is provided corresponding to the power supply line 70*a*, and the switch 81*b* is provided corresponding to the power supply line 70*b*. The switch 81*c* is provided corresponding to the power supply line 70*c*, and the switch 81*d* is provided corresponding to the power supply line 70*d*. As each of the switches 81, for example, a MOSFET or the like can be used.

The switch controller 82 controls an on-off state of each of the switches 81. The switch controller 82 controls the on-off states of all the switches 81 so that a part of the switches 81 is turned on and the rest is turned off in response to an instruction signal from the outside. For example, when it is desired to give the directivity biased in the direction indicated by the white arrow in FIG. 17, the switch controller 82 controls the switches 81*a* and 81*c* to the on state and the switches 81*b* and 81*d* to the off state by the instruction signal. Accordingly, among the power supply lines 70, power is supplied to the opposing conductor 50 via the power supply lines 70*a* and 70*c*, and power is not supplied from the power supply lines 70*b* and 70*d*. Among the power supply lines 70, the power supply lines 70*a* and 70*c* function as substantial power supply lines. The power supply line 70*a* extends in the X direction, and the power supply line 70*c* extends in the Y direction. Therefore, the combination of the X-direction component and the Y-direction component provided by the two power supply lines 70*a* and 70*c* can provide directivity in the direction of the white arrow.

Figure 18:
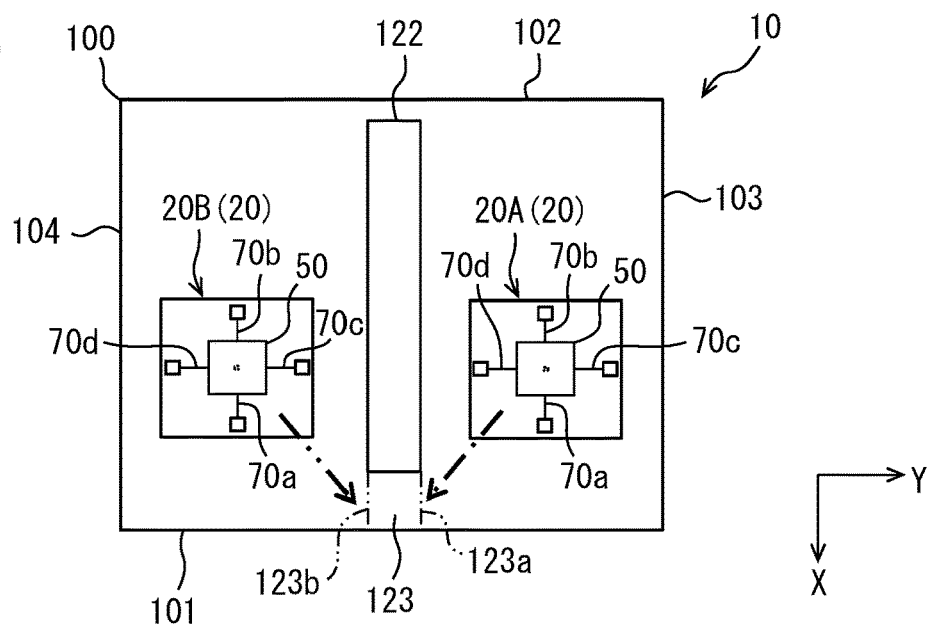
FIG. 18 is a plan view showing an electronic device.

FIG. 18 shows an example of the electronic device 10 provided with the zeroth-order resonant antenna 20 described above. The electronic device 10 includes a housing 100 made of metal, two wireless devices, and a metal member 122. The wireless devices and the metal member 122 are housed in the housing 100. Each of the wireless devices includes the zeroth-order resonant antenna 20 having the above-described configuration. In FIG. 18, for convenience, only the zeroth-order resonant antennas 20 in the wireless devices are drawn. Further, in a manner similar to FIG. 17, the base member 30 is omitted. The two zeroth-order resonant antennas 20 (wireless devices) are arranged side by side in the Y direction. The structure and arrangement of the zeroth-order resonant antenna 20 are the same as those shown in FIG. 17. In the following, the zeroth-order resonant antenna 20 close to the side wall 103 may be referred to as a zeroth-order resonant antenna 20A, and the zeroth-order resonant antenna 20 close to the side wall 104 may be referred to as a zeroth-order resonant antenna 20B.

The metal member 122 is, for example, a metal case of an electronic component, a wiring member such as a bus bar, or the like arranged in the housing 100. The metal member 122 is arranged between the two zeroth-order resonant antennas 20 in a plan view. The metal member 122 extends in the X direction and limits the propagation direction of radio waves. A space 123 is provided between the end surface of the metal member 122 and the housing 100 including the side wall 101.

The space 123 extends in the Y direction along the end face of the metal member 122. In the space 123, the propagation direction of radio waves is limited by the metal bodies including the metal member 122 and the housing 100. Specifically, the propagation direction of radio wave is limited to end portions of the space 123. The metal body has openings 123*a* and 123*b* as end portions of the space 123. The opening 123*a* is provided at the end portion of the side surface of the metal member 122 close to the side wall 103. The opening 123*b* is provided at the end of the side surface of the metal member 122 close to the side wall 104. In FIG. 18, the openings 123*a* and 123*b* are shown by the dashed double-dotted lines.

The opposing conductor 50 of the zeroth-order resonant antenna 20A and the opening 123*a* are shifted in the X and Y directions. In a plan view, the direction from the opposing conductor 50 toward the opening 123*a* is located between the two power supply lines 70*a* and 70*d*. In other words, in a plan view, a virtual straight line connecting the substantially center of the opposing conductor 50 and the substantially center of the width of the opening 123*a* is located between the power supply lines 70*a* and 70*d*. In this case, an instruction signal for turning on the switches 81*a* and 81*d* and turning off the switches 81*b* and 81*c* is input to the switch controller 82.

Upon receiving the instruction signal, the switch controller 82 controls the switches 81*a* and 81*d* in the on state and the switches 81*b* and 81*c* in the off state. Accordingly, power is supplied from the power supply lines 70*a* and 70*d*, and is not supplied from the power supply lines 70*b* and 70*c*. Due to the combination of the X-direction component and the Y-direction component provided by the two power supply lines 70*a* and 70*d*, the zeroth-order resonant antenna 20A has a directivity biased in the direction of the arrow of the dashed dotted line, that is, in the direction toward the opening 123*a*.

Similarly, the opposing conductor 50 of the zeroth-order resonant antenna 20B and the opening 123*b* are shifted in the X and Y directions. In a plan view, the direction from the opposing conductor 50 toward the opening 123*b* is located between the two power supply lines 70*a* and 70*c*. In other words, in a plan view, a virtual straight line connecting the substantially center of the opposing conductor 50 and the substantially center of the width of the opening 123*b* is located between the power supply lines 70*a* and 70*c*. In this case, an instruction signal for turning on the switches 81a and 81c and turning off the switches 81b and 81d is input to the switch controller 82.

Upon receiving the instruction signal, the switch controller 82 controls the switches 81a and 81c in the on state and the switches 81b and 81d in the off state. Accordingly, power is supplied from the power supply lines 70a and 70c, and is not supplied from the power supply lines 70b and 70d. Due to the combination of the X-direction component and the Y-direction component provided by the two power supply lines 70a and 70c, the zeroth-order resonant antenna 20B has a directivity biased in the direction of the arrow of the dashed double-dotted line, that is, in the direction toward the opening 123b.

<Summary of Fourth Embodiment>

According to the present embodiment, the power supply controller 80 can select a part of the power supply lines 70 to supply power to the opposing conductor 50 so as to have directivity in the direction toward the opening. Therefore, it is not necessary to pattern the power supply line 70 according to the positional relationship between the opposing conductor 50 of the zeroth-order resonant antenna 20 and the opening of the metal body. For example, in a configuration in which wireless communication is performed in the housing 100 as in the present embodiment, the zeroth-order resonant antennas 20A and 20B can be formed to have a common configuration.

In the present embodiment, power is supplied to the two power supply lines 70 that sandwich the direction from the opposite conductor 50 toward the corresponding openings 123a and 123b in a plan view, and power is not supplied to the remaining two power supply lines 70 so as to realize a desired directivity. However, in another example, power may be supplied only to the power supply line 70 having the extension direction closest to the direction from the opposite conductor 50 toward the corresponding openings 123a and 123b, and power may not be supplied to the remaining three power supply lines 70. For example, when the direction from the opposing conductor 50 toward the corresponding openings 123a and 123b, that is, the above-described virtual straight line and an extension direction of one of the power supply lines 70 substantially coincide with each other, power may be supplied only to the one of the power supply lines 70.

Figure 19:
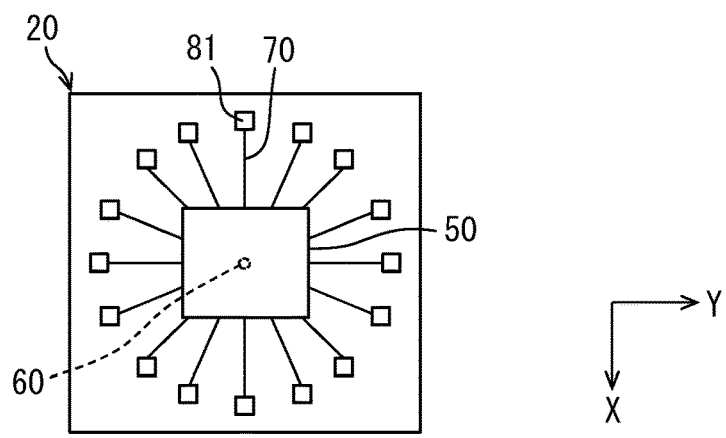
FIG. 19 is a diagram showing a modified example of a zeroth-order resonant antenna.

The number of power supply lines 70 is not limited to the above example. For example, as in a modification example shown in FIG. 19, 16 power supply lines 70 are electrically connected to the opposing conductor 50 having a rectangular shape. In a plan view, the power supply lines 70 extend from different positions on the edges of the opposing conductors 50 in different directions so as to surround the opposing conductors 50. Specifically, the power supply lines 70 extend along virtual straight lines passing through the substantially center of the opposing conductor 50. The power supply lines 70 are provided radially with respect to the opposing conductor 50. Switches 81 are provided for the power supply lines 70, respectively. A switch controller 82 (not shown) controls on-off states of all the switches 81.

As described above, as the number of power supply lines 70 increases, the probability that one of the power supply lines 70 and the direction from the opposite conductor 50 toward the opening coincide with each other increases. Therefore, the desired directivity can be obtained by supplying power to a small number of power supply lines 70, preferably only one of the power supply lines 70.

As described above, the planar shape of the opposing conductor 50 is not limited to the rectangular shape. In the case of an equilateral triangle or a circle, at least three power supply lines 70 may be provided. By providing three power supply lines 70 so that the central angle is approximately 120 degrees with respect to the substantially center of the opposing conductor 50, directivity can be provided in any direction orthogonal to the Z direction.

Other Embodiments

The disclosure in this specification and drawings etc. is not limited to the above-described embodiments. The disclosure encompasses the above-described embodiments and modifications based on the embodiments by those skilled in the art. For example, the disclosure is not limited to the combinations of parts and/or elements shown in the embodiments. The present disclosure may be implemented in various combinations. The disclosure may have additional parts that may be added to the embodiments. The disclosure covers omissions of parts and/or elements of the embodiments. The disclosure covers replacement or combination of components, elements between one of the embodiments and another. The disclosed technical scope is not limited to the description of the embodiments. The several technical ranges disclosed are indicated by the description of the claims, and should be construed to include all modifications within the meaning and range equivalent to the description of the claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

When an element or a layer is described as "disposed above" or "connected," the element or the layer may be directly disposed above or connected to another element or another layer, or an intervening element or an intervening layer may be present. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "back", "bottom", "low", "top", "high", etc. are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" or "directly below" another element or feature is directed "above" the other element or feature. Therefore, the term "below" can include both above and below. The device may be oriented in another direction (rotated 90 degrees or in any other direction) and the spatially relative terms used herein are interpreted accordingly.

An example in which the zeroth-order resonant antenna 20 includes the base member 30 has been described, but the present disclosure is not limited to this. The zeroth-order resonant antenna 20 may also have a configuration without the base member 30.

What is claimed is:

1. An electronic device comprising:
one or more zeroth-order resonant antennas each including:
  a ground plate configured to provide a ground potential;
  an opposing conductor arranged at a predetermined distance from the ground plate in a plate thickness direction of the ground plate;
  a power supply line electrically connected to the opposing conductor; and
  a short-circuit portion electrically connecting the opposing conductor and the ground plate; and
a metal body configured to limit a propagation direction of a radio wave transmitted from or received by the one or more zeroth-order resonant antennas and having an opening, wherein
the power supply line extends from an edge of the opposing conductor toward the opening in a plane orthogonal to the plate thickness direction.

2. The electronic device according to claim 1, further comprising
a housing that houses the one or more zeroth-order resonant antennas, wherein
the housing includes, as the metal body, a case made of a metal and having the opening.

3. The electronic device according to claim 1, further comprising:
a first wireless device including one of the zeroth-order resonant antennas;
a second wireless device including another one of the zeroth-order resonant antennas and configured to perform a wireless communication with the first wireless device;
a housing made of a metal and housing the first wireless device and the second wireless device; and
a metal member housed in the housing, wherein
the metal body is at least one of the housing and the metal member.

4. The electronic device according to claim 3, wherein
the metal member extends in a first direction orthogonal to the plate thickness direction, and is located between the first wireless device and the second wireless device in a second direction orthogonal to the first direction and the plate thickness direction,
the opening is provided between an end portion of the metal member and the housing facing the end portion, and
in the zeroth-order resonant antenna in the first wireless device, the power supply line extends toward the opening.

5. The electronic device according to claim 3, wherein
the metal member extends in a first direction orthogonal to the plate thickness direction,
the zeroth-order resonant antenna in the second wireless device is disposed in a middle portion of a space defined by the metal member and the housing and extending in the first direction,
the opening is provided at an end portion of the metal member, and
in the zeroth-order resonant antenna in the second wireless device, the power supply line extends toward the opening.

6. The electronic device according to claim 1, wherein
the power supply line includes a portion extending in a first direction orthogonal to the plate thickness direction and a portion extending in a second direction orthogonal to the plate thickness direction and the first direction.

7. An electronic device comprising:
one or more zeroth-order resonant antennas each including:
  a ground plate configured to provide a ground potential;
  an opposing conductor arranged at a predetermined distance from the ground plate in a plate thickness direction of the ground plate;
  a plurality of power supply lines electrically connected to the opposing conductor and extending in different directions from different positions of edges of the opposing conductor so as to surround the opposing conductor in a plane orthogonal to the plate thickness direction;
  a short-circuit portion electrically connecting the opposing conductor and the ground plate; and
  a power supply controller configured to control power supply to the power supply lines; and
a metal body configured to limit a propagation direction of a radio wave transmitted from or received by the one or more zeroth-order resonant antennas and having an opening, wherein
the power supply controller is configured to supply power to a part of the power supply lines including the power supply line having an extension direction closest to a direction from the opposing conductor toward the opening or the two power supply lines sandwiching the direction toward the opening in the plane.

* * * * *